United States Patent
Han et al.

(10) Patent No.: US 11,908,798 B2
(45) Date of Patent: Feb. 20, 2024

(54) INTEGRATED CIRCUIT DEVICES HAVING IMPROVED CONTACT PLUG STRUCTURES THEREIN

(71) Applicant: Samsung Electronics Co., Ltd., Suwon-si (KR)

(72) Inventors: Won Kyu Han, Seoul (KR); Myeongsoo Lee, Seoul (KR); Rakhwan Kim, Suwon-si (KR); Woojin Jang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 244 days.

(21) Appl. No.: 17/406,887

(22) Filed: Aug. 19, 2021

(65) Prior Publication Data
US 2022/0199526 A1 Jun. 23, 2022

(30) Foreign Application Priority Data
Dec. 23, 2020 (KR) .......................... 10-2020-0182097

(51) Int. Cl.
*H01L 23/528* (2006.01)
*H01L 23/522* (2006.01)
*H01L 27/092* (2006.01)

(52) U.S. Cl.
CPC ...... *H01L 23/5283* (2013.01); *H01L 23/5226* (2013.01); *H01L 27/092* (2013.01)

(58) Field of Classification Search
CPC .................. H01L 23/5283; H01L 23/5226; H01L 27/092

USPC ........................................................... 257/774
See application file for complete search history.

(56) References Cited

U.S. PATENT DOCUMENTS

| | | | |
|---|---|---|---|
| 7,208,404 B2 | 4/2007 | Tsao et al. | |
| 7,291,557 B2 | 11/2007 | Wan et al. | |
| 8,685,850 B2 | 4/2014 | Zhang et al. | |
| 10,163,794 B2 | 12/2018 | Wang et al. | |
| 10,290,580 B2 | 5/2019 | Liu et al. | |
| 2019/0164887 A1 | 5/2019 | Wang et al. | |
| 2020/0098688 A1 | 3/2020 | Shi et al. | |
| 2021/0313226 A1* | 10/2021 | Park ................. | H01L 21/76805 |

* cited by examiner

*Primary Examiner* — Tu-Tu V Ho
(74) *Attorney, Agent, or Firm* — Myers Bigel, P.A.

(57) ABSTRACT

An integrated circuit device includes a substrate and a first electrically insulating layer on the substrate. An electrically conductive contact plug is provided, which extends at least partially through the first electrically insulating layer. The contact plug includes a protrusion having a top surface that is spaced farther from the substrate relative to a top surface of a portion of the first electrically insulating layer extending adjacent the contact plug. An electrically conductive line is provided with a terminal end, which extends on a first portion of the protrusion. A second electrically insulating layer is provided, which extends on a second portion of the protrusion and on the first electrically insulating layer. The second electrically insulating layer has a sidewall, which extends opposite a sidewall of the terminal end of the electrically conductive line.

17 Claims, 19 Drawing Sheets

FIG. 12
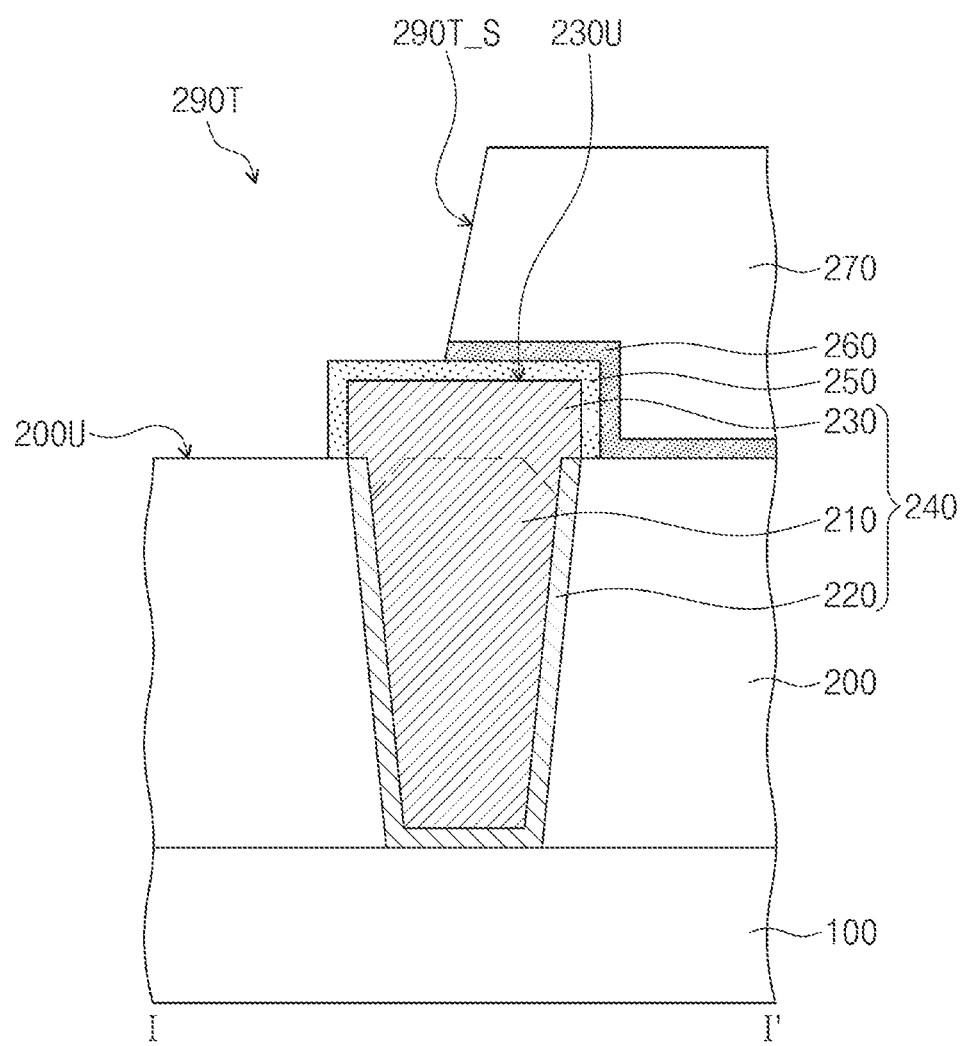
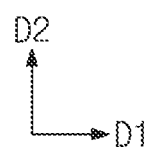

INTEGRATED CIRCUIT DEVICES HAVING IMPROVED CONTACT PLUG STRUCTURES THEREIN

REFERENCE TO PRIORITY APPLICATION

This U.S. non-provisional patent application claims priority under 35 U.S.C. § 119 to Korean Patent Application No. 10-2020-0182097, filed Dec. 23, 2020, the disclosure of which is hereby incorporated herein by reference in its entirety.

BACKGROUND

Embodiments of the inventive concepts relate to integrated circuit devices and, more particularly, to integrated circuit devices having electrical contacts therein, which include contact plugs and conductive lines connected to said contact plugs.

Integrated circuits may include semiconductor devices, such as metal-oxide-semiconductor field effect transistors (MOSFETs). As sizes and design rules of semiconductor devices have been reduced, MOSFETs have been scaled down. Operating characteristics of semiconductor devices may be deteriorated by reduction in size of MOSFETs. Accordingly, various methods for forming semiconductor devices which have excellent performance while overcoming limitations by the high integration have been studied.

SUMMARY

Embodiments of the inventive concepts may provide an integrated circuit device having a semiconductor device therein with improved electrical characteristics.

In one aspect, a semiconductor device may include a first interlayer insulating layer on a substrate, a conductive line extending on the first interlayer insulating layer, and a second interlayer insulating layer extending on the first interlayer insulating layer and covering a sidewall of the conductive line. A contact plug is provided, which penetrates the first interlayer insulating layer and is connected to the conductive line. The contact plug may include a protrusion, which protrudes above a top surface of the first interlayer insulating layer as a contact plug "post". In some embodiments, the conductive line may overlap with a portion of the protrusion, and the second interlayer insulating layer may overlap with another portion of the protrusion.

In another aspect, a semiconductor device may include a first interlayer insulating layer on a substrate, a conductive line on the first interlayer insulating layer, a second interlayer insulating layer extending on the first interlayer insulating layer (and covering a sidewall of the conductive line), a line barrier pattern extending between the sidewall of the conductive line and the second interlayer insulating layer, and a contact plug penetrating the first interlayer insulating layer and connected to the conductive line. The contact plug may include a protrusion, which extends above a top surface of the first interlayer insulating layer (relative to the substrate). The line barrier pattern may be disposed on a top surface of the protrusion.

BRIEF DESCRIPTION OF THE DRAWINGS

The inventive concepts will become more apparent in view of the attached drawings and accompanying detailed description.

FIGS. 10 to 12 are cross-sectional views corresponding to the line I-I' of FIG. 1 to illustrate a method of manufacturing a semiconductor device, according to some embodiments of the inventive concepts.

DETAILED DESCRIPTION OF THE EMBODIMENTS

Hereinafter, embodiments of the inventive concepts will be described in detail with reference to the accompanying drawings.

Figure 1:
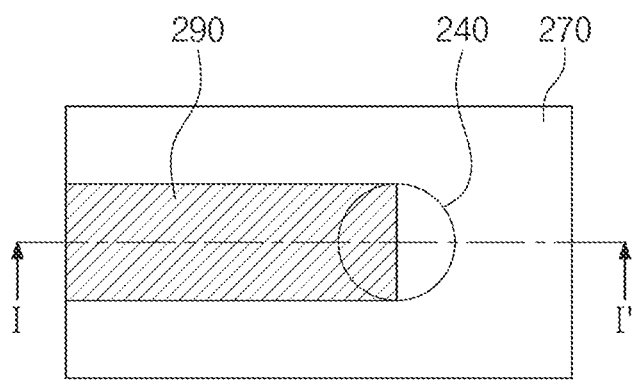
FIG. 1 is a plan view illustrating a semiconductor device according to some embodiments of the inventive concepts.
Figure 2:
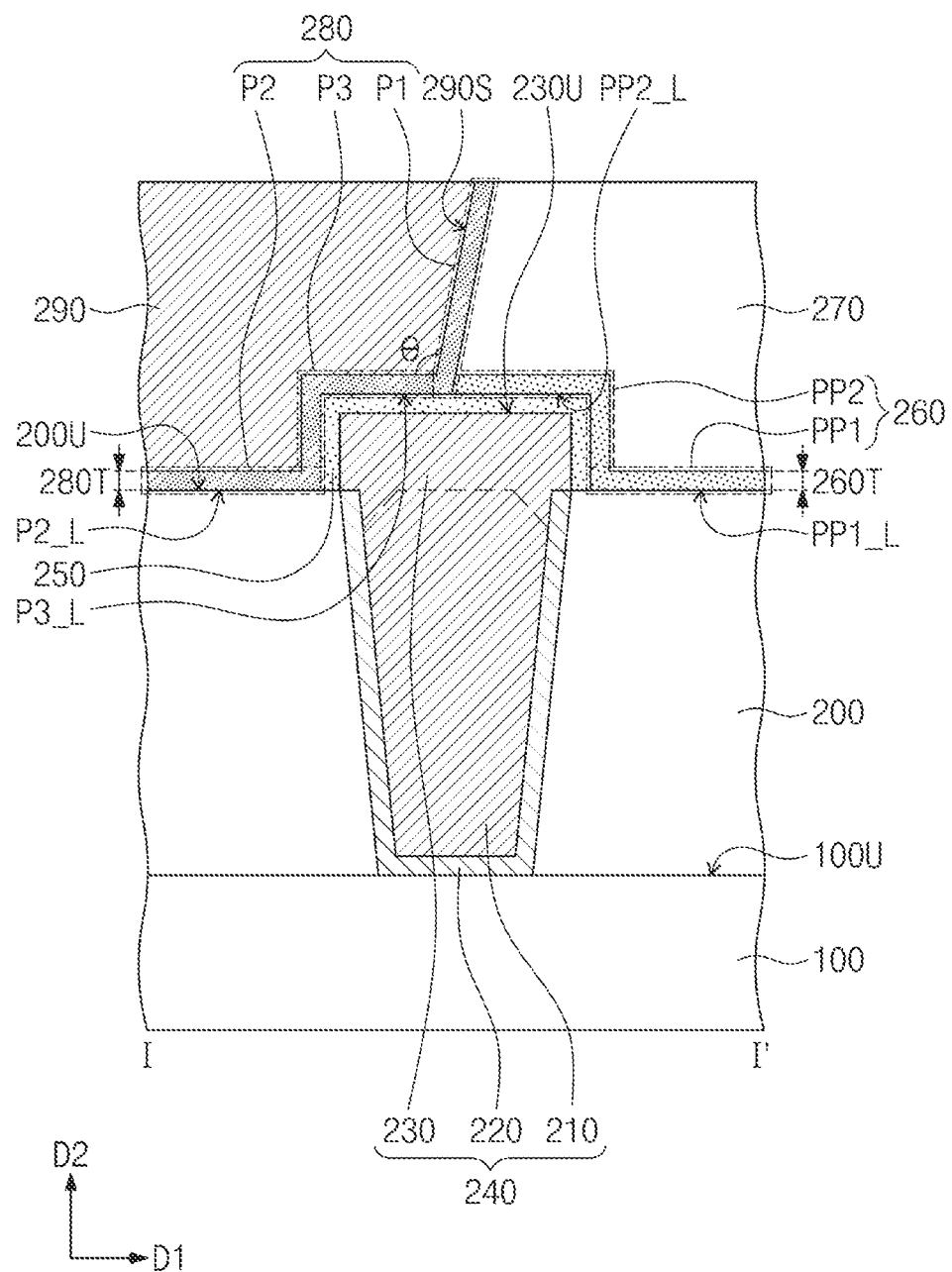
FIG. 2 is a cross-sectional view taken along a line I-I' of FIG. 1.

FIG. 1 is a plan view illustrating a semiconductor device according to some embodiments of the inventive concepts. FIG. 2 is a cross-sectional view taken along a line I-I' of FIG. 1. Referring to FIGS. 1 and 2, a first interlayer insulating layer 200 may be disposed on a substrate 100. The substrate 100 may include a semiconductor substrate, such as a silicon substrate or a silicon-on-insulator (SOI) substrate; and, the first interlayer insulating layer 200 may include at least one of a silicon oxide layer, a silicon nitride layer, a silicon oxynitride layer, or a low-k dielectric layer.

A conductive line 290 may be disposed on the first interlayer insulating layer 200. A contact plug 240 may penetrate the first interlayer insulating layer 200 and may be electrically connected to the conductive line 290. For example, the conductive line 290 may extend long in a first direction D1 parallel to a top surface 1000 of the substrate 100. The conductive line 290 may include a metal (e.g., copper).

A second interlayer insulating layer 270 may be disposed on the first interlayer insulating layer 200 and may cover a sidewall 290S of the conductive line 290. For example, the second interlayer insulating layer 270 may include at least one of a silicon oxide layer, a silicon nitride layer, a silicon oxynitride layer, or a low-k dielectric layer.

The contact plug 240 may include a body portion 210 penetrating the first interlayer insulating layer 200, and a protrusion 230 protruding above a top surface 200U of the first interlayer insulating layer 200. The protrusion 230 may protrude from the body portion 210 in a second direction D2 perpendicular to the top surface 1000 of the substrate 100 and may be in direct contact with the body portion 210. In some embodiments, the body portion 210 and the protrusion 230 may include the same material. For example, the body portion 210 and the protrusion 230 may include the same metal (e.g., copper). In this case, the body portion 210 and the protrusion 230 may be in contact with each other without an interface therebetween to constitute one body. In certain embodiments, the body portion 210 and the protrusion 230 may include different materials. For example, the body portion 210 and the protrusion 230 may include different metals; however, other conductive materials are also possible. In this case, the contact plug 240 may have a contact interface between the body portion 210 and the protrusion 230, and at least a portion of the protrusion 230 may extend into the body portion 210.

The contact plug 240 may further include a contact barrier pattern 220 between the first interlayer insulating layer 200 and the body portion 210. The contact barrier pattern 220 may be disposed between a sidewall of the body portion 210 and the first interlayer insulating layer 200 and may extend between a bottom surface of the body portion 210 and the substrate 100. The body portion 210 of the contact plug 240 may be spaced apart from the first interlayer insulating layer 200 with the contact barrier pattern 220 interposed therebetween. In some embodiments, the protrusion 230 of the contact plug 240 may cover a topmost surface of the body portion 210 and a topmost surface of the contact barrier pattern 220. The contact barrier pattern 220 may include a different material from that (or those) of the body portion 210 and the protrusion 230. For example, the contact barrier pattern 220 may include a different metal from that (or those) of the body portion 210 and the protrusion 230 and may include a metal and/or a conductive metal nitride (e.g., Ta and/or TaN).

The conductive line 290 may overlap with a portion of the protrusion 230 of the contact plug 240, and the second interlayer insulating layer 270 may overlap with another portion of the protrusion 230 of the contact plug 240. The conductive line 290 may cover the portion of the protrusion 230, and the second interlayer insulating layer 270 may cover the other portion of the protrusion 230. The sidewall 290S of the conductive line 290 may be located on a top surface 230U of the protrusion 230. In some embodiments, the sidewall 290S of the conductive line 290 may be inclined to form an obtuse angle with a bottom surface of the conductive line 290 adjacent thereto. In other words, an angle θ between the sidewall 290S of the conductive line 290 and the bottom surface of the conductive line 290 adjacent thereto may be an obtuse angle (θ>90 degrees). For example, the angle θ may range from about 90 degrees to about 105 degrees, however, other obtuse angles are also possible.

A line barrier pattern 280 may be disposed between the sidewall 290S of the conductive line 290 and the second interlayer insulating layer 270. In some embodiments, the line barrier pattern 280 may extend between the protrusion 230 of the contact plug 240 and the conductive line 290 and between the first interlayer insulating layer 200 and the conductive line 290. The line barrier pattern 280 may include a first portion P1 between the sidewall 290S of the conductive line 290 and the second interlayer insulating layer 270, a second portion P2 between the conductive line 290 and the first interlayer insulating layer 200, and a third portion P3 between the conductive line 290 and the protrusion 230. The first portion P1 of the line barrier pattern 280 may be disposed on the top surface 230U of the protrusion 230, and the third portion P3 of the line barrier pattern 280 may extend along a portion of the top surface 230U of the protrusion 230. The second portion P2 of the line barrier pattern 280 may extend along the top surface 200U of the first interlayer insulating layer 200 and may be in contact with the top surface 200U of the first interlayer insulating layer 200. The line barrier pattern 280 may include a metal and/or a conductive metal nitride (e.g., Ta and/or TaN), and a thickness 280T of the line barrier pattern 280 may range from about 10 Å to about 90 Å.

An etch stop layer 260 may be disposed between the first interlayer insulating layer 200 and the second interlayer insulating layer 270 and may extend between the protrusion 230 of the contact plug 240 and the second interlayer insulating layer 270. The line barrier pattern 280 may be disposed between the etch stop layer 260 and the conductive line 290, and the etch stop layer 260 may be in contact with the first portion P1 of the line barrier pattern 280 on the top surface 230U of the protrusion 230. The etch stop layer 260 may include a first portion PP1 between the first interlayer insulating layer 200 and the second interlayer insulating layer 270, and a second portion PP2 between the protrusion 230 of the contact plug 240 and the second interlayer insulating layer 270. The first portion PP1 of the etch stop layer 260 may extend along the top surface 200U of the first interlayer insulating layer 200 and may be in contact with the top surface 200U of the first interlayer insulating layer 200. The second portion PP2 of the etch stop layer 260 may extend along another portion of the top surface 230U of the protrusion 230 and may be in contact with the line barrier pattern 280 on the top surface 230U of the protrusion 230.

A bottom surface PP1_L of the first portion PP1 of the etch stop layer 260 may be located at substantially the same height as a bottom surface P2_L of the second portion P2 of the line barrier pattern 280 from the substrate 100. In some embodiments, on the topmost surface 230U of the protrusion 230 of the contact plug 240, a bottom surface PP2_L of the second portion PP2 of the etch stop layer 260 may be located at substantially the same height as a bottom surface P3_L of the third portion P3 of the line barrier pattern 280 with respect to the substrate 100.

The etch stop layer 260 may include a metal nitride and may include a different metal from that of the line barrier pattern 280. For example, the etch stop layer 260 may include aluminum nitride (AlN). For example, a thickness 260T of the etch stop layer 260 may range from about 10 Å to about 25 Å.

A capping layer 250 may be disposed between the protrusion 230 of the contact plug 240 and the etch stop layer 260. The etch stop layer 260 may be spaced apart from the protrusion 230 of the contact plug 240 with the capping layer 250 interposed therebetween. In some embodiments, the capping layer 250 may extend between the protrusion 230 of the contact plug 240 and the line barrier pattern 280. The line barrier pattern 280 may be spaced apart from the protrusion 230 of the contact plug 240 with the capping layer 250 interposed therebetween. The capping layer 250 may extend along the top surface 230U of the protrusion 230 of the contact plug 240 and may be in contact with the top surface 230U of the protrusion 230. The capping layer 250 may include a different metal from that of the contact plug 240. The capping layer 250 may include a different metal from that of the protrusion 230 and the body portion 210 of the contact plug 240 and may include a different metal from that of the contact barrier pattern 220. The capping layer 250 may include, for example, cobalt (Co), however, other metals are also possible.

The third portion P3 of the line barrier pattern 280 may be disposed between the capping layer 250 and the conductive line 290, and the second portion PP2 of the etch stop layer 260 may be disposed between the capping layer 250 and the second interlayer insulating layer 270.

To increase a degree of freedom of design of a semiconductor device, the conductive line 290 may be formed to partially overlap with a contact plug disposed thereunder. In this case, a contact area between the conductive line 290 and the contact plug may be reduced, and thus a resistance between the conductive line 290 and the contact plug may be increased.

According to the embodiments of the inventive concepts, the contact plug 240 may include the protrusion 230 (e.g., vertical post), and the conductive line 290 may be formed to partially overlap with the protrusion 230 of the contact plug 240. Since the conductive line 290 partially overlaps with the protrusion 230, a contact area between the contact plug 240 and the conductive line 290 may be relatively increased, and thus a resistance between the conductive line 290 and the contact plug 240 may be reduced. As a result, electrical characteristics of a semiconductor device may be improved, and a degree of freedom of design of the semiconductor device may be easily increased.

Figure 3:
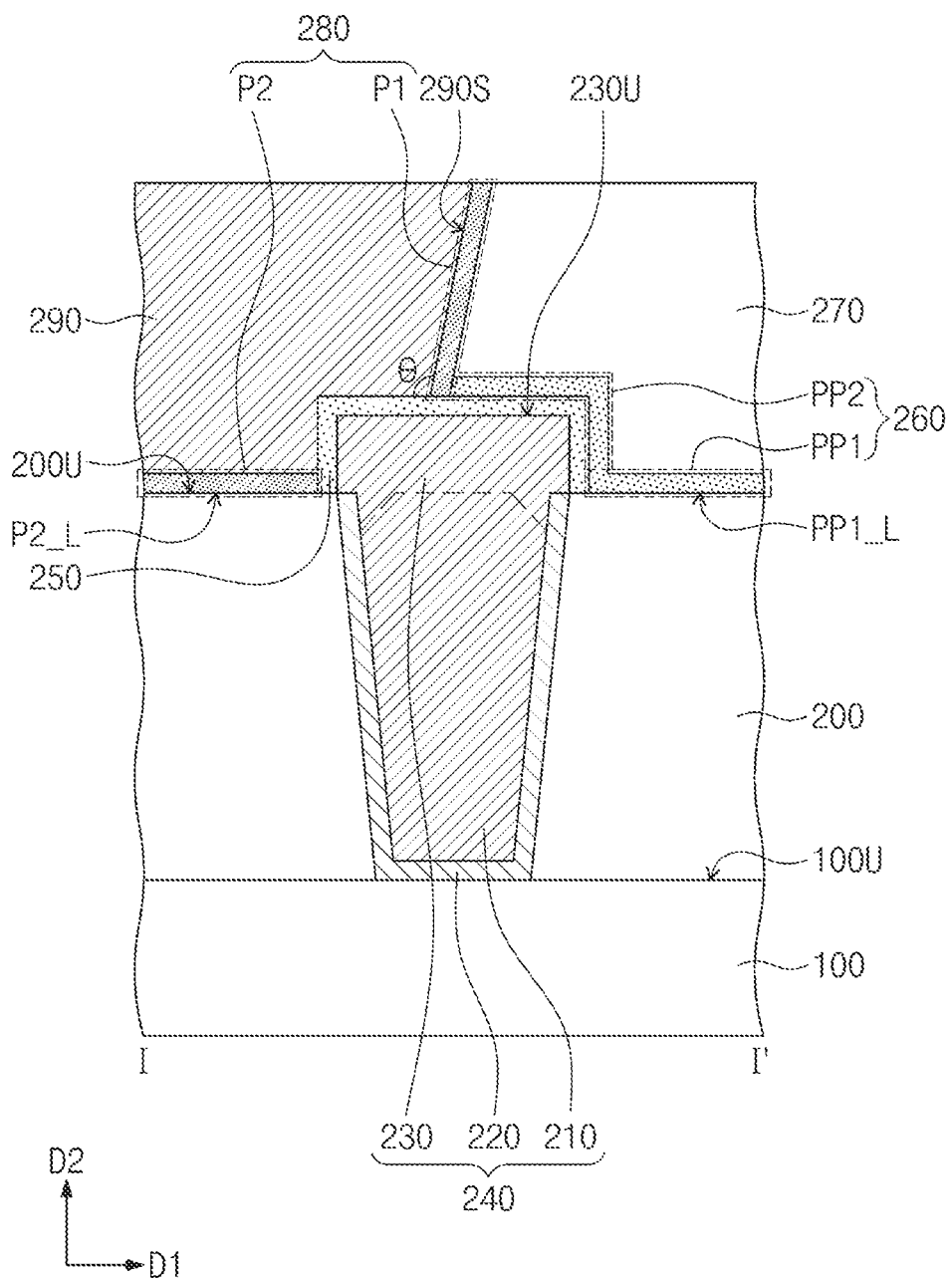
FIGS. 3 to 9 are cross-sectional views corresponding to the line I-I' of FIG. 1 to illustrate semiconductor devices according to some embodiments of the inventive concepts.

FIG. 3 is a cross-sectional view corresponding to the line I-I' of FIG. 1 to illustrate a semiconductor device according to some embodiments of the inventive concepts. Hereinafter, differences between the present embodiments and the embodiments described with reference to FIGS. 1 and 2 will be mainly described for the purpose of ease and convenience in explanation. Referring to FIGS. 1 and 3, a line barrier pattern 280 may be disposed between the sidewall 290S of the conductive line 290 and the second interlayer insulating layer 270. In some embodiments, the line barrier pattern 280 may include a first portion P1 between the sidewall 290S of the conductive line 290 and the second interlayer insulating layer 270, and a second portion P2 between the conductive line 290 and the first interlayer insulating layer 200. In the present embodiments, the line barrier pattern 280 may not include the third portion P3 of FIG. 2. The first portion P1 of the line barrier pattern 280 may be disposed on the top surface 230U of the protrusion 230. The second portion P2 of the line barrier pattern 280 may extend along the top surface 200U of the first interlayer insulating layer 200 and may be in contact with the top surface 200U of the first interlayer insulating layer 200.

An etch stop layer 260 may be disposed between the first interlayer insulating layer 200 and the second interlayer insulating layer 270 and may extend between the protrusion 230 of the contact plug 240 and the second interlayer insulating layer 270. The first portion P1 of the line barrier pattern 280 may be disposed between the etch stop layer 260 and the conductive line 290, and the etch stop layer 260 may be in contact with the first portion P1 of the line barrier pattern 280 on the top surface 230U of the protrusion 230. The etch stop layer 260 may include a first portion PP1 between the first interlayer insulating layer 200 and the second interlayer insulating layer 270, and a second portion PP2 between the protrusion 230 of the contact plug 240 and the second interlayer insulating layer 270. The first portion PP1 of the etch stop layer 260 may extend along the top surface 200U of the first interlayer insulating layer 200 and may be in contact with the top surface 200U of the first interlayer insulating layer 200. The second portion PP2 of the etch stop layer 260 may extend along a portion of the top surface 230U of the protrusion 230 and may be in contact with the first portion P1 of the line barrier pattern 280 on the top surface 230U of the protrusion 230. A bottom surface PP1_L of the first portion PP1 of the etch stop layer 260 may be located at substantially the same height as a bottom surface P2_L of the second portion P2 of the line barrier pattern 280 from the substrate 100.

A capping layer 250 may be disposed between the protrusion 230 of the contact plug 240 and the etch stop layer 260. The etch stop layer 260 may be spaced apart from the protrusion 230 of the contact plug 240 with the capping layer 250 interposed therebetween. In some embodiments, the capping layer 250 may extend between the protrusion 230 of the contact plug 240 and the conductive line 290. The conductive line 290 may be in contact with a portion of the capping layer 250. Each of the first and second portions P1 and P2 of the line barrier pattern 280 may be spaced apart from the protrusion 230 of the contact plug 240 with the capping layer 250 interposed therebetween. The capping layer 250 may extend along the top surface 230U of the protrusion 230 of the contact plug 240 and may be in contact with the top surface 230U of the protrusion 230.

Figure 4:
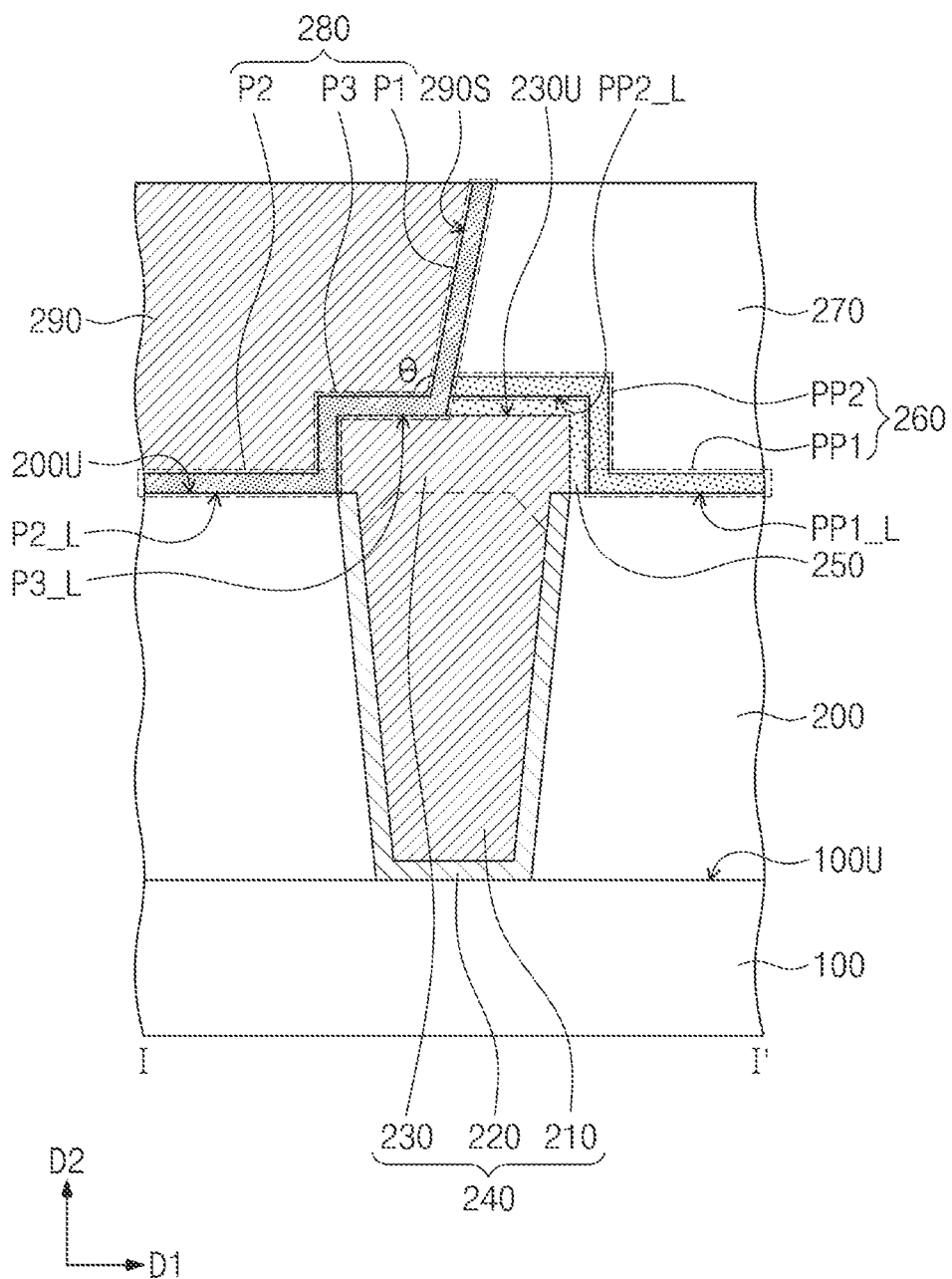

FIG. 4 is a cross-sectional view corresponding to the line I-I' of FIG. 1 to illustrate a semiconductor device according to some embodiments of the inventive concepts. Hereinafter, differences between the present embodiments and the embodiments described with reference to FIGS. 1 and 2 will be mainly described for the purpose of ease and convenience in explanation.

Referring to FIGS. 1 and 4, a line barrier pattern 280 may be disposed between the sidewall 290S of the conductive line 290 and the second interlayer insulating layer 270. In some embodiments, the line barrier pattern 280 may extend between the protrusion 230 of the contact plug 240 and the conductive line 290 and between the first interlayer insulating layer 200 and the conductive line 290. The line barrier pattern 280 may include a first portion P1 between the sidewall 290S of the conductive line 290 and the second interlayer insulating layer 270, a second portion P2 between the conductive line 290 and the first interlayer insulating layer 200, and a third portion P3 between the conductive line 290 and the protrusion 230. The first portion P1 of the line barrier pattern 280 may be disposed on the top surface 230U of the protrusion 230. The third portion P3 of the line barrier pattern 280 may extend along a portion of the top surface 230U of the protrusion 230 and may be in contact with the portion of the top surface 230U of the protrusion 230. The second portion P2 of the line barrier pattern 280 may extend along the top surface 200U of the first interlayer insulating layer 200 and may be in contact with the top surface 200U of the first interlayer insulating layer 200.

An etch stop layer 260 may be disposed between the first interlayer insulating layer 200 and the second interlayer insulating layer 270 and may extend between the protrusion 230 of the contact plug 240 and the second interlayer insulating layer 270. The line barrier pattern 280 may be disposed between the etch stop layer 260 and the conductive line 290, and the etch stop layer 260 may be in contact with the first portion P1 of the line barrier pattern 280 on the top surface 230U of the protrusion 230. The etch stop layer 260 may include a first portion PP1 between the first interlayer insulating layer 200 and the second interlayer insulating layer 270, and a second portion PP2 between the protrusion 230 of the contact plug 240 and the second interlayer insulating layer 270. The first portion PP1 of the etch stop layer 260 may extend along the top surface 200U of the first interlayer insulating layer 200 and may be in contact with the top surface 200U of the first interlayer insulating layer 200. The second portion PP2 of the etch stop layer 260 may extend along another portion of the top surface 230U of the protrusion 230 and may be in contact with the line barrier pattern 280 on the top surface 230U of the protrusion 230.

A bottom surface PP1_L of the first portion PP1 of the etch stop layer 260 may be located at substantially the same height as a bottom surface P2_L of the second portion P2 of the line barrier pattern 280 from the substrate 100. In some embodiments, on the topmost surface 230U of the protrusion 230 of the contact plug 240, a bottom surface PP2_L of the second portion PP2 of the etch stop layer 260 may be located at a higher height than a bottom surface P3_L of the third portion P3 of the line barrier pattern 280 with respect to the substrate 100.

A capping layer 250 may be disposed between the protrusion 230 of the contact plug 240 and the etch stop layer 260. The etch stop layer 260 may be spaced apart from the protrusion 230 of the contact plug 240 with the capping layer 250 interposed therebetween. In some embodiments, the capping layer 250 may be in contact with the line barrier pattern 280 on the top surface 230U of the protrusion 230.

Figure 5:
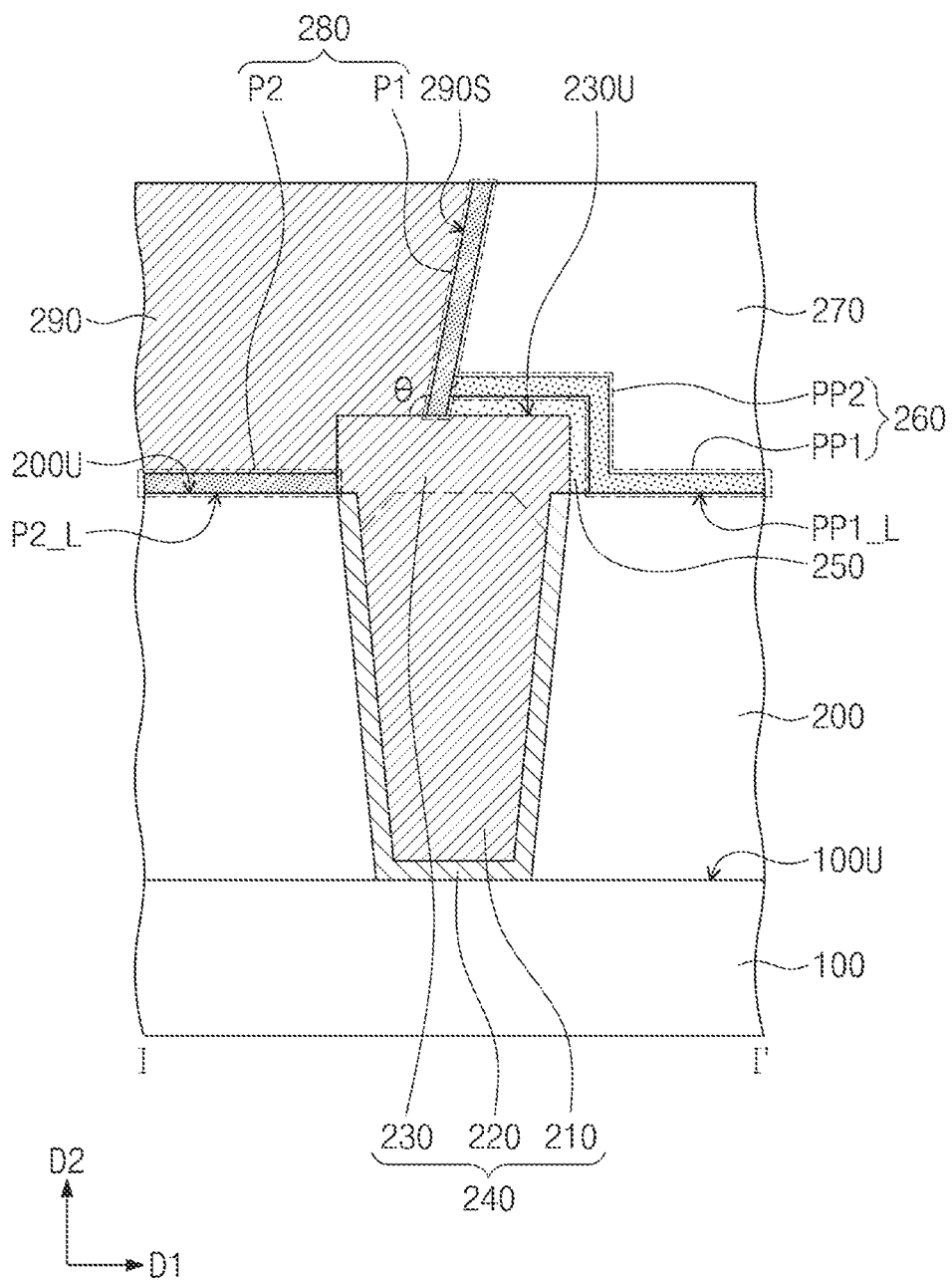

FIG. 5 is a cross-sectional view corresponding to the line I-I' of FIG. 1 to illustrate a semiconductor device according to some embodiments of the inventive concepts. Hereinafter, differences between the present embodiments and the embodiments described with reference to FIGS. 1 and 2 will be mainly described for the purpose of ease and convenience in explanation.

Referring to FIGS. 1 and 5, a line barrier pattern 280 may be disposed between the sidewall 290S of the conductive line 290 and the second interlayer insulating layer 270. In some embodiments, the line barrier pattern 280 may include a first portion P1 between the sidewall 290S of the conductive line 290 and the second interlayer insulating layer 270, and a second portion P2 between the conductive line 290 and the first interlayer insulating layer 200. In the present embodiments, the line barrier pattern 280 may not include the third portion P3 of FIG. 2. The first portion P1 of the line barrier pattern 280 may be disposed on the top surface 230U of the protrusion 230. The second portion P2 of the line barrier pattern 280 may extend along the top surface 200U of the first interlayer insulating layer 200 and may be in contact with the top surface 200U of the first interlayer insulating layer 200.

An etch stop layer 260 may be disposed between the first interlayer insulating layer 200 and the second interlayer insulating layer 270 and may extend between the protrusion 230 of the contact plug 240 and the second interlayer insulating layer 270. The first portion P1 of the line barrier pattern 280 may be disposed between the etch stop layer 260 and the conductive line 290, and the etch stop layer 260 may be in contact with the first portion P1 of the line barrier pattern 280 on the top surface 230U of the protrusion 230. The etch stop layer 260 may include a first portion PP1 between the first interlayer insulating layer 200 and the second interlayer insulating layer 270, and a second portion PP2 between the protrusion 230 of the contact plug 240 and the second interlayer insulating layer 270. The first portion PP1 of the etch stop layer 260 may extend along the top surface 200U of the first interlayer insulating layer 200 and may be in contact with the top surface 200U of the first interlayer insulating layer 200. The second portion PP2 of the etch stop layer 260 may extend along a portion of the top surface 230U of the protrusion 230 and may be in contact with the first portion P1 of the line barrier pattern 280 on the top surface 230U of the protrusion 230. A bottom surface PP1_L of the first portion PP1 of the etch stop layer 260 may be located at substantially the same height as a bottom surface P2_L of the second portion P2 of the line barrier pattern 280 from the substrate 100.

A capping layer 250 may be disposed between the protrusion 230 of the contact plug 240 and the etch stop layer 260. The etch stop layer 260 may be spaced apart from the protrusion 230 of the contact plug 240 with the capping layer 250 interposed therebetween. In some embodiments, the capping layer 250 may extend along a portion of the top surface 230U of the protrusion 230 and may be in contact with the first portion P1 of the line barrier pattern 280 on the top surface 230U of the protrusion 230. The conductive line 290 may be in contact with a portion of the protrusion 230 of the contact plug 240. Each of the first and second portions P1 and P2 of the line barrier pattern 280 may be in contact with the protrusion 230 of the contact plug 240.

Figure 6:
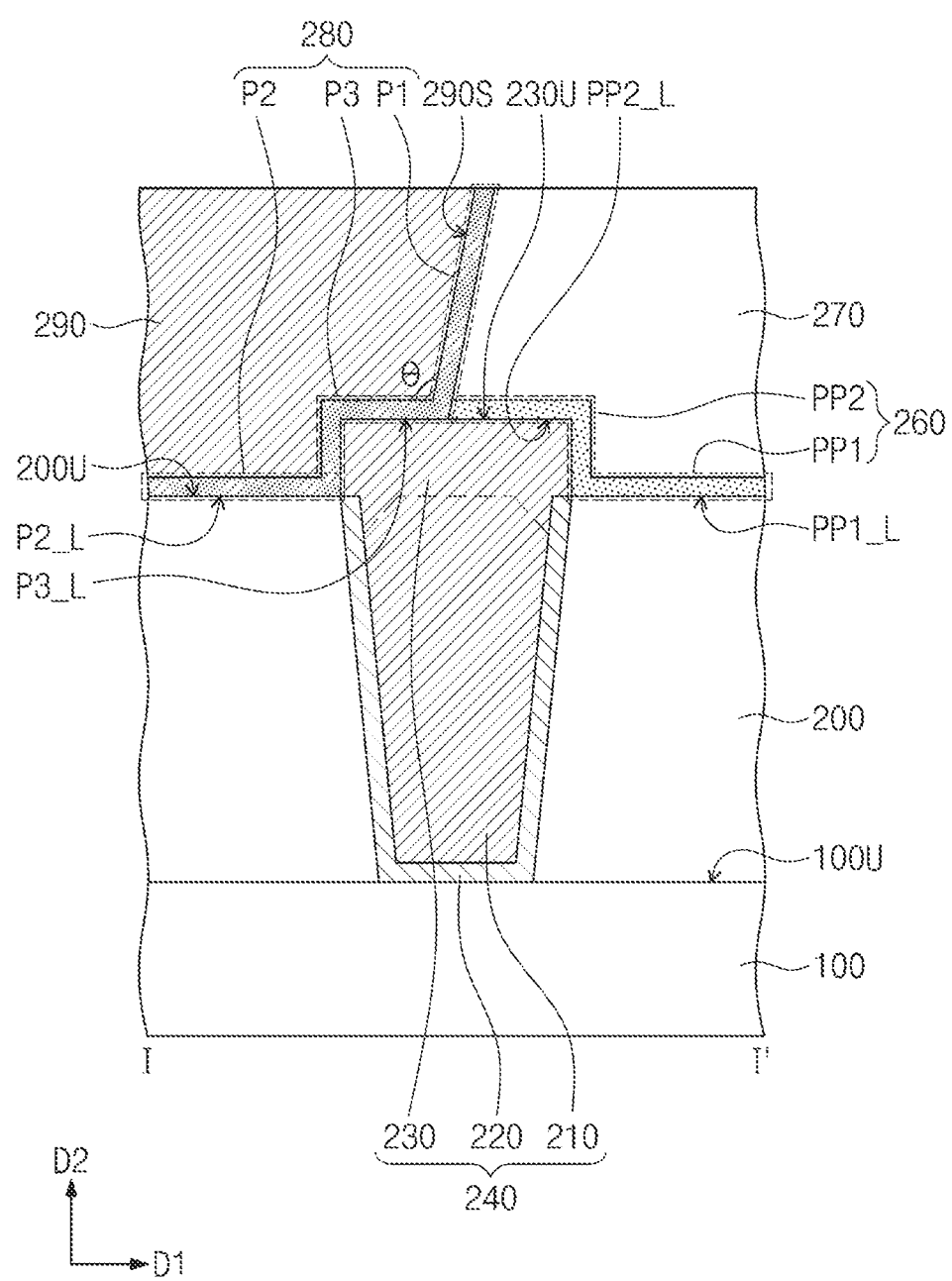

FIG. 6 is a cross-sectional view corresponding to the line I-I' of FIG. 1 to illustrate a semiconductor device according to some embodiments of the inventive concepts. Hereinafter, differences between the present embodiments and the embodiments described with reference to FIGS. 1 and 2 will be mainly described for the purpose of ease and convenience in explanation.

Referring to FIGS. 1 and 6, a line barrier pattern 280 may be disposed between the sidewall 290S of the conductive line 290 and the second interlayer insulating layer 270. In some embodiments, the line barrier pattern 280 may extend between the protrusion 230 of the contact plug 240 and the conductive line 290 and between the first interlayer insulating layer 200 and the conductive line 290. The line barrier pattern 280 may include a first portion P1 between the sidewall 290S of the conductive line 290 and the second interlayer insulating layer 270, a second portion P2 between the conductive line 290 and the first interlayer insulating layer 200, and a third portion P3 between the conductive line 290 and the protrusion 230. The first portion P1 of the line barrier pattern 280 may be disposed on the top surface 230U of the protrusion 230 and may be in contact with the top surface 230U of the protrusion 230. The third portion P3 of the line barrier pattern 280 may extend along a portion of the top surface 230U of the protrusion 230 and may be in contact with the portion of the top surface 230U of the protrusion 230. The second portion P2 of the line barrier pattern 280 may extend along the top surface 200U of the first interlayer insulating layer 200 and may be in contact with the top surface 200U of the first interlayer insulating layer 200.

An etch stop layer 260 may be disposed between the first interlayer insulating layer 200 and the second interlayer insulating layer 270 and may extend between the protrusion 230 of the contact plug 240 and the second interlayer insulating layer 270. The line barrier pattern 280 may be disposed between the etch stop layer 260 and the conductive line 290, and the etch stop layer 260 may be in contact with the line barrier pattern 280 on the top surface 230U of the protrusion 230. The etch stop layer 260 may include a first portion PP1 between the first interlayer insulating layer 200 and the second interlayer insulating layer 270, and a second portion PP2 between the protrusion 230 of the contact plug 240 and the second interlayer insulating layer 270. The first portion PP1 of the etch stop layer 260 may extend along the top surface 200U of the first interlayer insulating layer 200 and may be in contact with the top surface 200U of the first interlayer insulating layer 200. The second portion PP2 of the etch stop layer 260 may extend along another portion of the top surface 230U of the protrusion 230 and may be in contact with the other portion of the top surface 230U of the protrusion 230. The second portion PP2 of the etch stop layer 260 may be in contact with the line barrier pattern 280 on the top surface 230U of the protrusion 230.

A bottom surface PP1_L of the first portion PP1 of the etch stop layer 260 may be located at substantially the same height as a bottom surface P2_L of the second portion P2 of the line barrier pattern 280 from the substrate 100. In some embodiments, on the topmost surface 230U of the protrusion 230 of the contact plug 240, a bottom surface PP2_L of the second portion PP2 of the etch stop layer 260 may be located at substantially the same height as a bottom surface P3_L of the third portion P3 of the line barrier pattern 280 with respect to the substrate 100.

Figure 7:
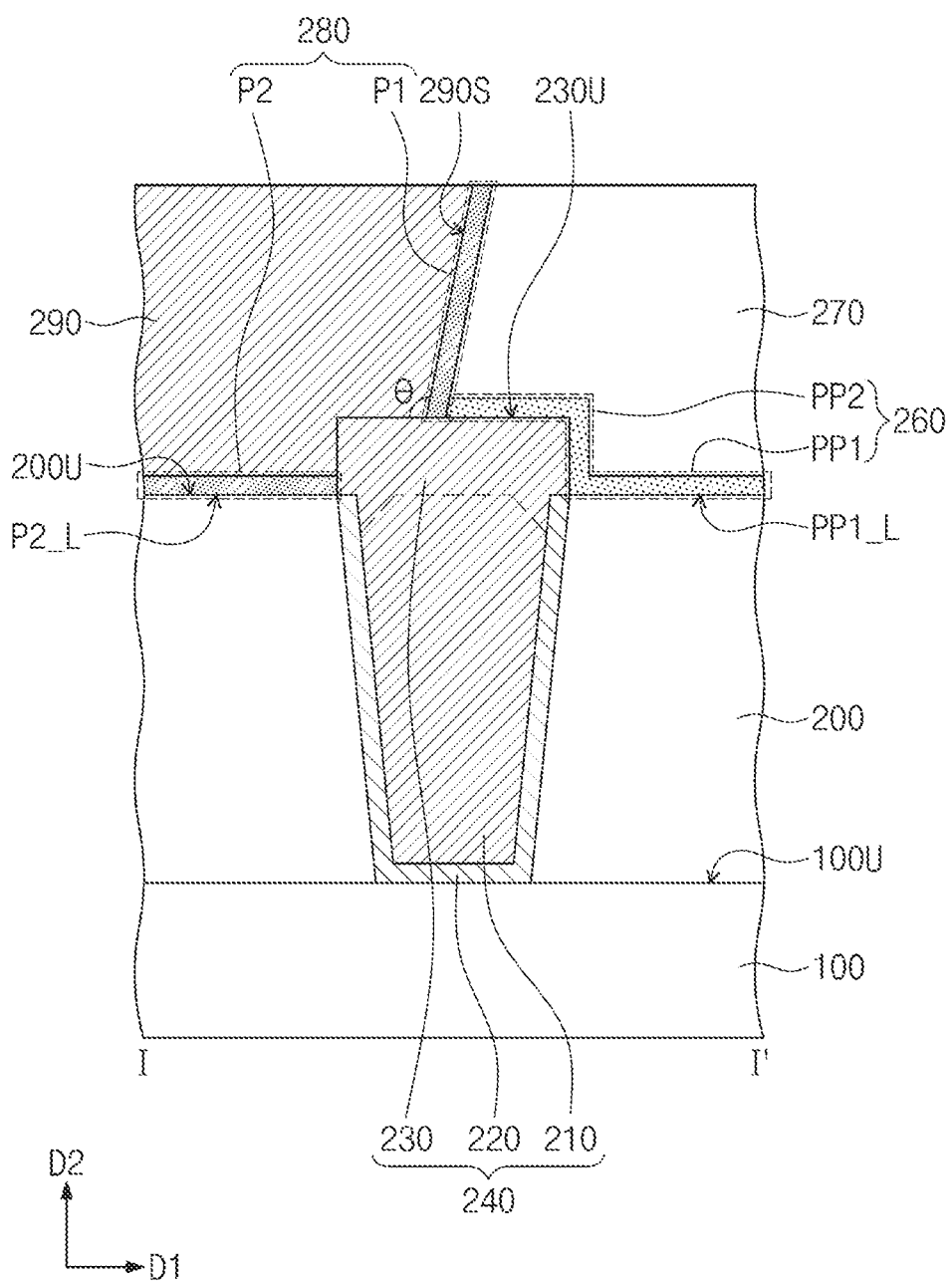

FIG. 7 is a cross-sectional view corresponding to the line I-I' of FIG. 1 to illustrate a semiconductor device according to some embodiments of the inventive concepts. Hereinafter, differences between the present embodiments and the embodiments described with reference to FIGS. 1 and 2 will be mainly described for the purpose of ease and convenience in explanation.

Referring to FIGS. 1 and 7, a line barrier pattern 280 may be disposed between the sidewall 290S of the conductive line 290 and the second interlayer insulating layer 270. In some embodiments, the line barrier pattern 280 may include a first portion P1 between the sidewall 290S of the conductive line 290 and the second interlayer insulating layer 270, and a second portion P2 between the conductive line 290 and the first interlayer insulating layer 200. In the present embodiments, the line barrier pattern 280 may not include the third portion P3 of FIG. 2. The first portion P1 of the line barrier pattern 280 may be disposed on the top surface 230U of the protrusion 230. The second portion P2 of the line barrier pattern 280 may extend along the top surface 200U of the first interlayer insulating layer 200 and may be in contact with the top surface 200U of the first interlayer insulating layer 200. The conductive line 290 may be in contact with a portion of the protrusion 230 of the contact plug 240. Each of the first and second portions P1 and P2 of the line barrier pattern 280 may be in contact with the protrusion 230 of the contact plug 240.

An etch stop layer 260 may be disposed between the first interlayer insulating layer 200 and the second interlayer insulating layer 270 and may extend between the protrusion 230 of the contact plug 240 and the second interlayer insulating layer 270. The first portion P1 of the line barrier pattern 280 may be disposed between the etch stop layer 260 and the conductive line 290, and the etch stop layer 260 may be in contact with the first portion P1 of the line barrier pattern 280 on the top surface 230U of the protrusion 230. The etch stop layer 260 may include a first portion PP1 between the first interlayer insulating layer 200 and the second interlayer insulating layer 270, and a second portion PP2 between the protrusion 230 of the contact plug 240 and the second interlayer insulating layer 270. The first portion PP1 of the etch stop layer 260 may extend along the top surface 200U of the first interlayer insulating layer 200 and may be in contact with the top surface 200U of the first interlayer insulating layer 200. The second portion PP2 of the etch stop layer 260 may extend along a portion of the top surface 230U of the protrusion 230 and may be in contact with the portion of the top surface 230U of the protrusion 230. The second portion PP2 of the etch stop layer 260 may be in contact with the first portion P1 of the line barrier pattern 280 on the top surface 230U of the protrusion 230. A bottom surface PP1_L of the first portion PP1 of the etch stop layer 260 may be located at substantially the same height as a bottom surface P2_L of the second portion P2 of the line barrier pattern 280 from the substrate 100.

Figure 8:
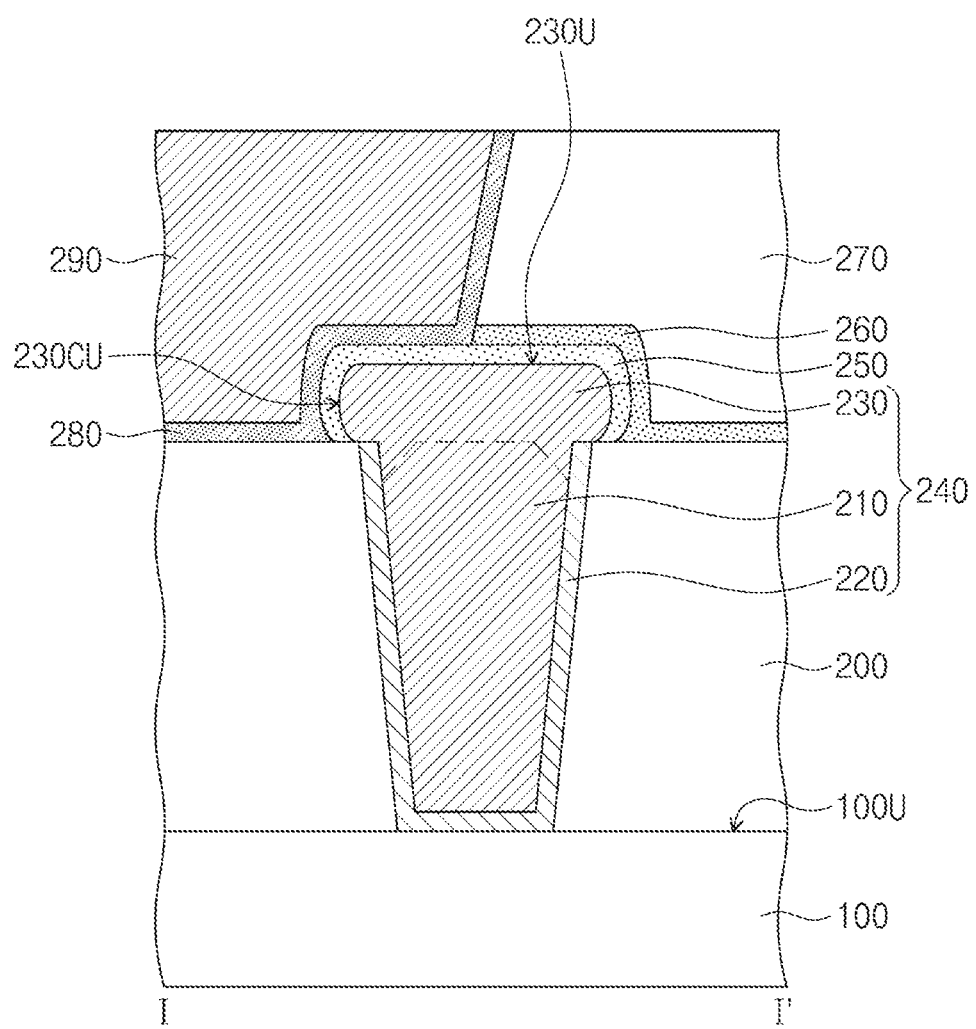

FIG. 8 is a cross-sectional view corresponding to the line I-I' of FIG. 1 to illustrate a semiconductor device according to some embodiments of the inventive concepts. Hereinafter, differences between the present embodiments and the embodiments described with reference to FIGS. 1 and 2 will be mainly described for the purpose of ease and convenience in explanation. Referring to FIGS. 1 and 8, according to some embodiments, the protrusion 230 of the contact plug 240 may have a convex shape in a direction parallel to the top surface 100U of the substrate 100 (e.g., in the first direction D1 and an opposite direction to the first direction D1). Thus, a top surface 230U of the protrusion 230 may include a convex top surface 230CU that is convex in the direction parallel to the top surface 100U of the substrate 100 (e.g., in the first direction D1 and the opposite direction to the first direction D1). Except for the differences described above, other components and features of the semiconductor device according to the present embodiments may be substantially the same as corresponding components and features of the semiconductor device described with reference to FIGS. 1 and 2.

Figure 9:
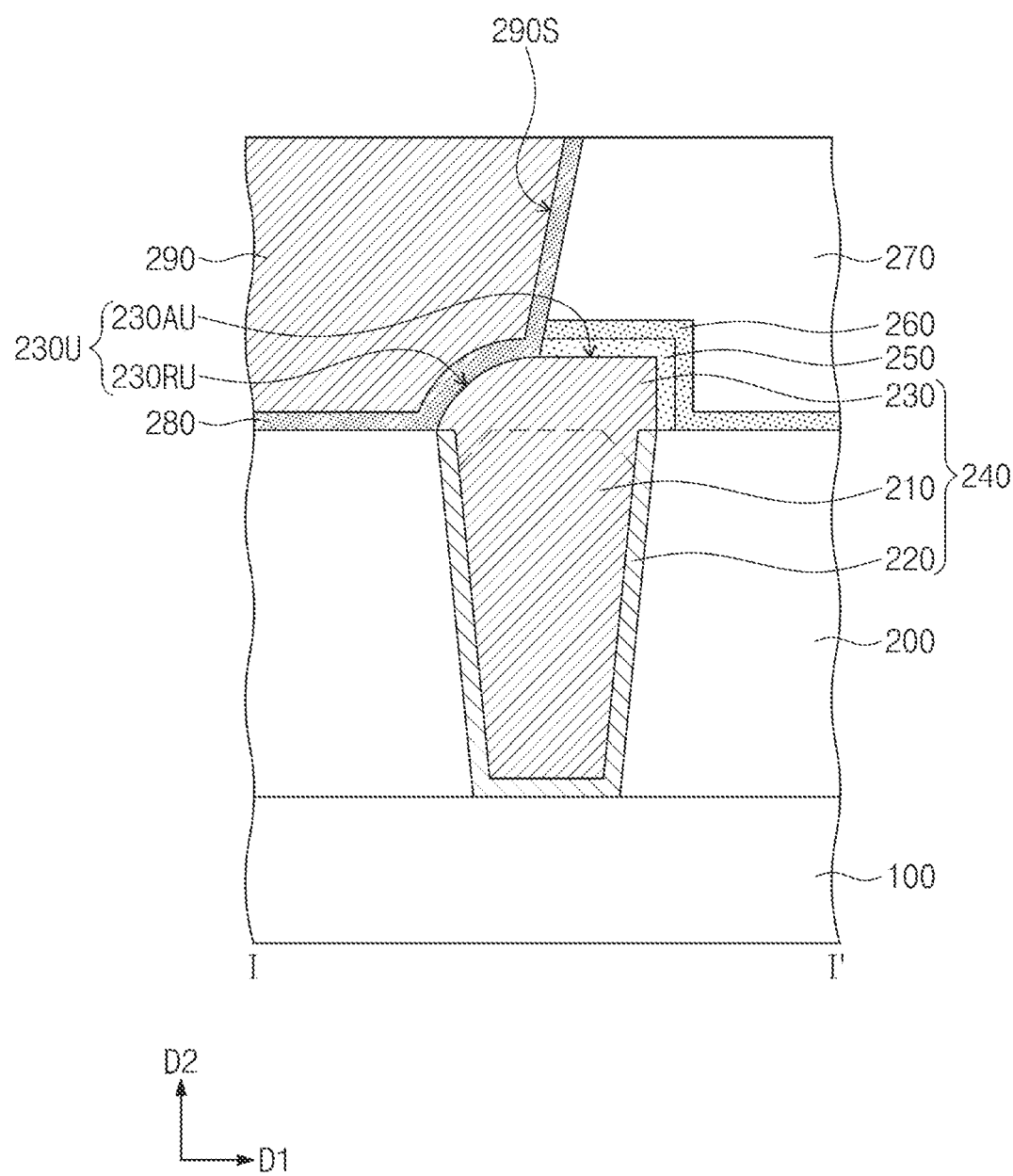

FIG. 9 is a cross-sectional view corresponding to the line I-I' of FIG. 1 to illustrate a semiconductor device according to some embodiments of the inventive concepts. Hereinafter, differences between the present embodiments and the embodiments described with reference to FIGS. 1 and 2 will be mainly described for the purpose of ease and convenience in explanation.

Referring to FIGS. 1 and 9, the conductive line 290 may overlap with a portion of the protrusion 230 of the contact plug 240, and the second interlayer insulating layer 270 may overlap with another portion of the protrusion 230 of the contact plug 240. The line barrier pattern 280 may be disposed between the sidewall 290S of the conductive line 290 and the second interlayer insulating layer 270 and may extend between the protrusion 230 of the contact plug 240 and the conductive line 290 and between the first interlayer insulating layer 200 and the conductive line 290.

In some embodiments, the portion of the protrusion 230, which overlaps with the conductive line 290, may have a rounded top surface 230RU, and the other portion of the protrusion 230, which overlaps with the second interlayer insulating layer 270, may have an angled top surface 230AU. Thus, the protrusion 230 may have an asymmetrical shape, and a top surface 230U of the protrusion 230 may include the rounded top surface 230RU and the angled top surface 230AU.

The line barrier pattern 280 may extend along the rounded top surface 230RU of the portion of the protrusion 230 and may be in contact with the rounded top surface 230RU. An etch stop layer 260 may be disposed between the first interlayer insulating layer 200 and the second interlayer insulating layer 270 and may extend between the protrusion 230 of the contact plug 240 and the second interlayer insulating layer 270. The etch stop layer 260 may extend along the angled top surface 230AU of the other portion of the protrusion 230. A capping layer 250 may be disposed between the protrusion 230 of the contact plug 240 and the etch stop layer 260. The capping layer 250 may extend along the angled top surface 230AU of the other portion of the protrusion 230 and may be in contact with the angled top surface 230AU. Each of the etch stop layer 260 and the capping layer 250 may be in contact with the line barrier pattern 280 on the top surface 230U of the protrusion 230. Except for the differences described above, other components and features of the semiconductor device according to the present embodiments may be substantially the same as corresponding components and features of the semiconductor device described with reference to FIGS. 1 and 2.

Figure 10:
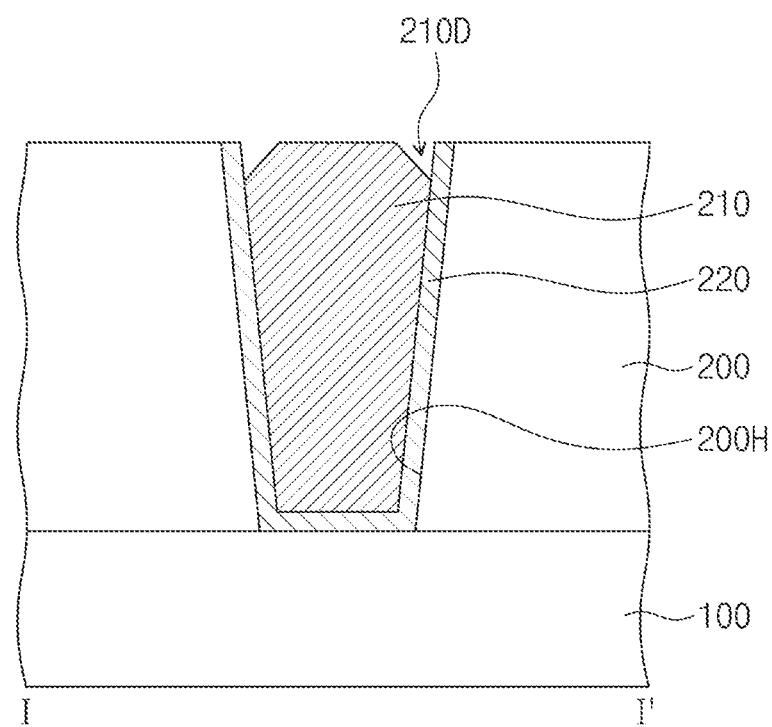
Figure 11:
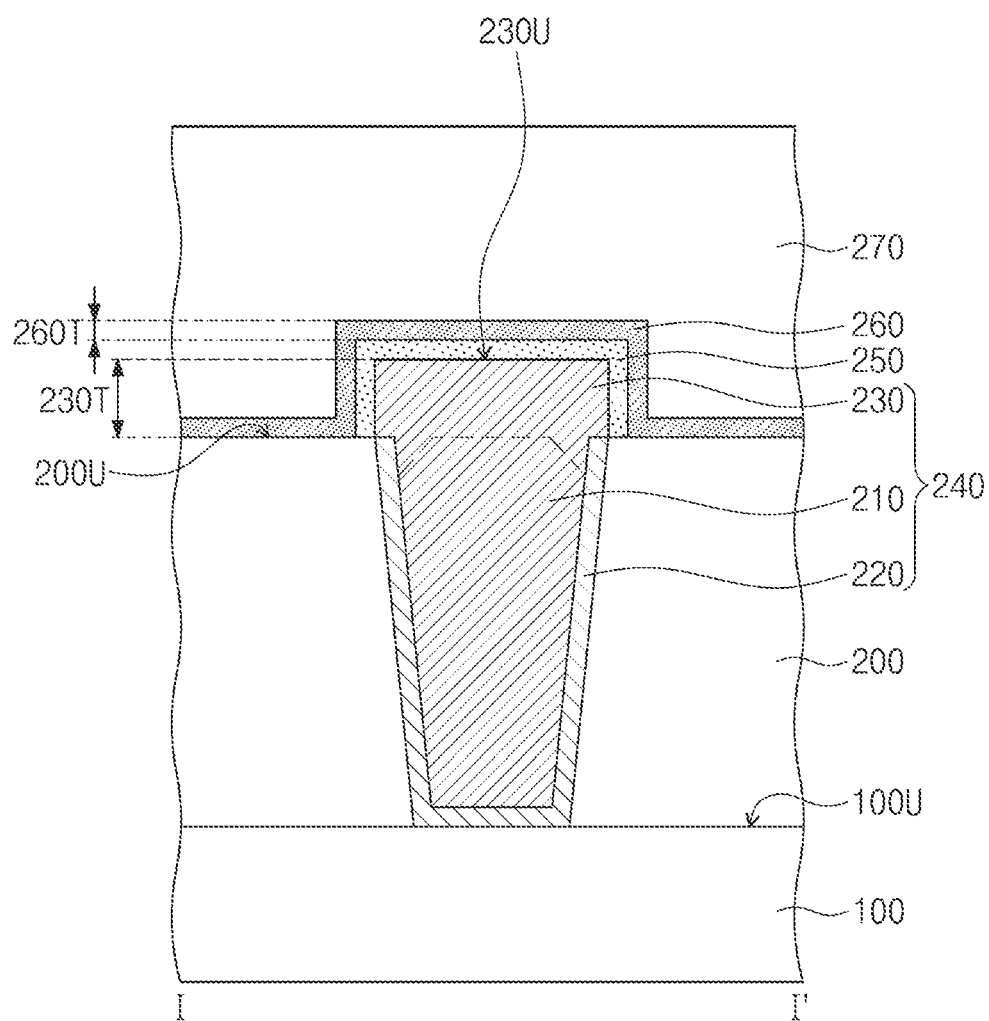

FIGS. 10 to 12 are cross-sectional views corresponding to the line I-I' of FIG. 1 to illustrate a method of manufacturing a semiconductor device, according to some embodiments of the inventive concepts. Hereinafter, the descriptions to the same technical features as described with reference to FIGS.

1 to 9 will be omitted or mentioned briefly for the purpose of ease and convenience in explanation.

Referring to FIGS. 1 and 10, a first interlayer insulating layer 200 may be formed on a substrate 100, and a contact hole 200H may be formed to penetrate the first interlayer insulating layer 200. For example, the formation of the contact hole 200H may include forming a mask pattern defining a region, in which the contact hole 200H will be formed, on the first interlayer insulating layer 200, anisotropically etching the first interlayer insulating layer 200 using the mask pattern as an etch mask, and removing the mask pattern after the etching process.

A body portion 210 of a contact plug and a contact barrier pattern 220 may be formed in the contact hole 200H. For example, the formation of the body portion 210 and the contact barrier pattern 220 may include forming a contact barrier layer filling a portion of the contact hole 200H on the first interlayer insulating layer 200, forming a contact conductive layer filling a remaining portion of the contact hole 200H on the contact barrier layer, and planarizing the contact conductive layer and the contact barrier layer until a top surface of the first interlayer insulating layer 200 is exposed. For example, the planarization of the contact conductive layer and the contact barrier layer may include performing an etch-back process or a chemical mechanical polishing (CMP) process. The body portion 210 and the contact barrier pattern 220 may be confined in the contact hole 200H by the planarization process. In some embodiments, an upper portion of the body portion 210 may be partially lost or removed by the planarization process, and thus a dent region 210D may be formed in the upper portion of the body portion 210.

Referring to FIGS. 1 and 11, a protrusion 230 of a contact plug may be selectively deposited on the body portion 210. The protrusion 230 may be selectively deposited on the body portion 210 by an electroless deposition method or a chemical vapor deposition (CVD) method. The protrusion 230 may be formed to protrude upward from a top surface 200U of the first interlayer insulating layer 200, and a thickness 230T of the protrusion 230 may range from about 20 Å to about 100 Å. The thickness 230T of the protrusion 230 may be a thickness measured from the top surface 200U of the first interlayer insulating layer 200. In some embodiments, the protrusion 230 may be formed to fill the dent region 210D of the body portion 210 and may be formed to cover a topmost surface of the contact barrier pattern 220. The body portion 210, the protrusion 230 and the contact barrier pattern 220 may constitute a contact plug 240.

In some embodiments, during the selective deposition, the protrusion 230 may be formed to have a shape convex in a direction parallel to the top surface 1000 of the substrate 100 (e.g., in the first direction D1 and an opposite direction to the first direction D1), as described with reference to FIG. 8. Thus, a top surface 230U of the protrusion 230 may include a convex top surface 230CU that is convex in the direction parallel to the top surface 100U of the substrate 100 (e.g., in the first direction D1 and the opposite direction to the first direction D1).

A capping layer 250 may be formed to cover the top surface 230U of the protrusion 230, and an etch stop layer 260 and a second interlayer insulating layer 270 may be sequentially formed on the capping layer 250. The etch stop layer 260 may be disposed between the first interlayer insulating layer 200 and the second interlayer insulating layer 270 and may extend along the top surface 230U of the protrusion 230. The capping layer 250 may extend along the top surface 230U of the protrusion 230 between the protrusion 230 and the etch stop layer 260. The etch stop layer 260 may be spaced apart from the protrusion 230 with the capping layer 250 interposed therebetween. A thickness 260T of the etch stop layer 260 may range from about 10 Å to about 25 Å. The second interlayer insulating layer 270 may be formed to cover the protrusion 230 and the first interlayer insulating layer 200. The capping layer 250 and the etch stop layer 260 may be disposed between the protrusion 230 and the second interlayer insulating layer 270, and the etch stop layer 260 may extend between the first interlayer insulating layer 200 and the second interlayer insulating layer 270.

Referring to FIGS. 1 and 12, a line trench 290T may be formed in the second interlayer insulating layer 270. The formation of the line trench 290T may include etching a portion of the second interlayer insulating layer 270 and a portion of the etch stop layer 260. The line trench 290T may expose a portion of the capping layer 250 and a portion of the top surface 200U of the first interlayer insulating layer 200. An inner sidewall 290T_S of the line trench 290T may be located on the top surface 230U of the protrusion 230. In some embodiments, the inner sidewall 290T_S of the line trench 290T may be inclined to form an obtuse angle with a bottom surface of the line trench 290T adjacent thereto.

In some embodiments, a line barrier pattern 280 and a conductive line 290 may be formed in the line trench 290T as illustrated in FIG. 2. For example, the formation of the line barrier pattern 280 and the conductive line 290 may include forming a line barrier layer filling a portion of the line trench 290T on the second interlayer insulating layer 270, forming a conductive layer filling a remaining portion of the line trench 290T on the line barrier layer, and planarizing the conductive layer and the line barrier layer until a top surface of the second interlayer insulating layer 270 is exposed.

In certain embodiments, a line barrier pattern 280 and a conductive line 290 may be formed in the line trench 290T as illustrated in FIG. 3. For example, the formation of the line barrier pattern 280 and the conductive line 290 may include forming a line barrier layer filling a portion of the line trench 290T on the second interlayer insulating layer 270, removing a portion of the line barrier layer adjacent to the top surface 230U of the protrusion 230, forming a conductive layer filling a remaining portion of the line trench 290T on the line barrier layer, and planarizing the conductive layer and the line barrier layer until the top surface of the second interlayer insulating layer 270 is exposed. In the present embodiments, since the portion of the line barrier layer adjacent to the top surface 230U of the protrusion 230 is removed, a portion of the capping layer 250 may be exposed. The conductive line 290 may be in contact with the exposed portion of the capping layer 250.

In certain embodiments, as illustrated in FIG. 4, the formation of the line trench 290T may include etching a portion of the second interlayer insulating layer 270, a portion of the etch stop layer 260, and a portion of the capping layer 250. In this case, the line trench 290T may expose a portion of the top surface 230U of the protrusion 230 and a portion of the top surface 200U of the first interlayer insulating layer 200. In the present embodiments, a line barrier pattern 280 and a conductive line 290 may be formed in the line trench 290T, and the line barrier pattern 280 may be in contact with the portion of the top surface 230U of the protrusion 230.

In certain embodiments, as illustrated in FIG. 5, the formation of the line trench 290T may include etching a portion of the second interlayer insulating layer 270, a portion of the etch stop layer 260, and a portion of the capping layer 250. In this case, the line trench 290T may expose a portion of the top surface 230U of the protrusion 230 and a portion of the top surface 200U of the first interlayer insulating layer 200. A line barrier pattern 280 and a conductive line 290 may be formed in the line trench 290T. For example, the formation of the line barrier pattern 280 and the conductive line 290 may include forming a line barrier layer filling a portion of the line trench 290T on the second interlayer insulating layer 270, removing a portion of the line barrier layer adjacent to the top surface 230U of the protrusion 230, forming a conductive layer filling a remaining portion of the line trench 290T on the line barrier layer, and planarizing the conductive layer and the line barrier layer until a top surface of the second interlayer insulating layer 270 is exposed. In the present embodiments, since the portion of the line barrier layer adjacent to the top surface 230U of the protrusion 230 is removed, a portion of the top surface 230U of the protrusion 230 may be exposed. The conductive line 290 may be in contact with the exposed portion of the top surface 230U of the protrusion 230.

In certain embodiments, as illustrated in FIG. 9, the formation of the line trench 290T may include etching a portion of the second interlayer insulating layer 270, a portion of the etch stop layer 260, and a portion of the capping layer 250. In this case, the line trench 290T may expose a portion of the top surface 230U of the protrusion 230 and a portion of the top surface 200U of the first interlayer insulating layer 200. A line barrier pattern 280 and a conductive line 290 may be formed in the line trench 290T, and the line barrier pattern 280 may be in contact with the portion of the top surface 230U of the protrusion 230. In the present embodiments, the line barrier pattern 280 may be formed using a physical vapor deposition (PVD) method, and thus the portion of the top surface 230U of the protrusion 230 may be rounded. Thus, the protrusion 230 may have an asymmetrical shape, and the top surface 230U of the protrusion 230 may include a rounded top surface 230RU overlapping with the conductive line 290, and an angled top surface 230AU overlapping with the second interlayer insulating layer 270.

Figure 13:
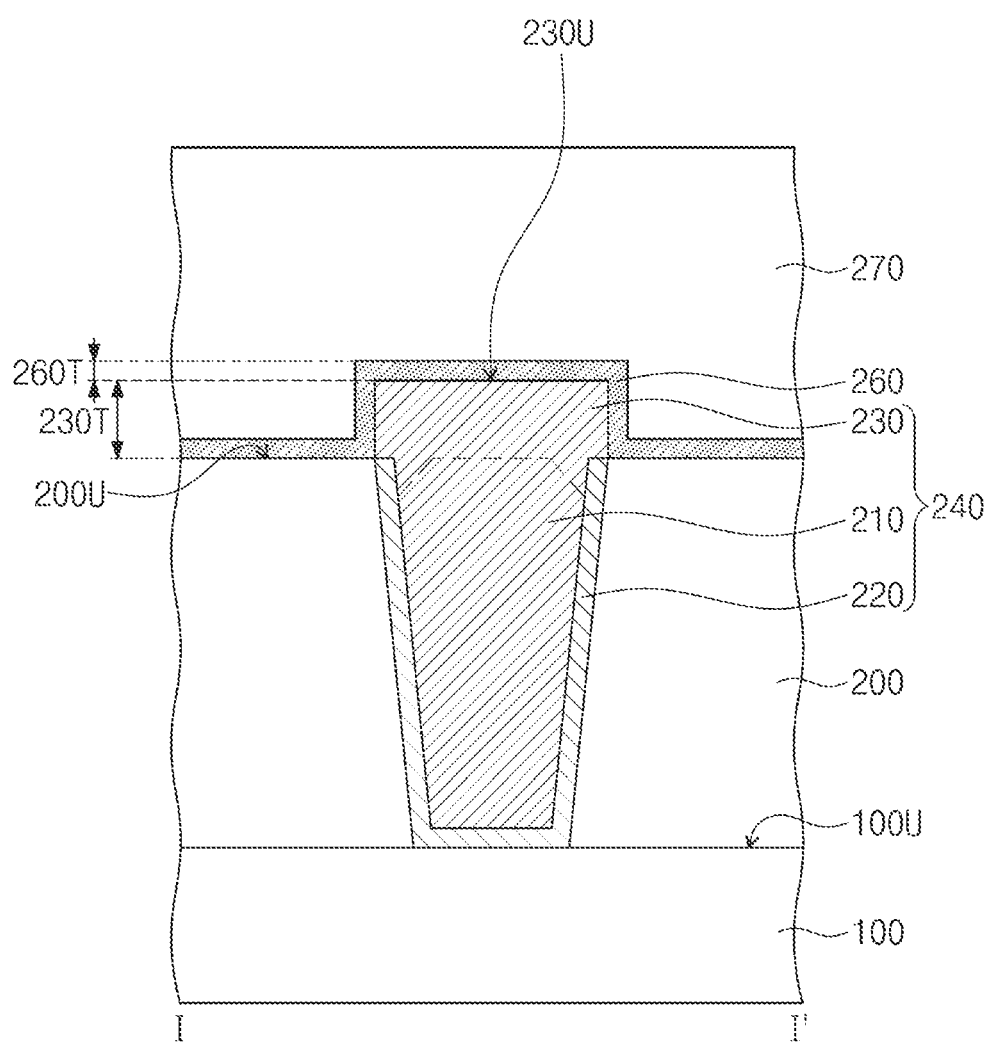
FIGS. 13 and 14 are cross-sectional views corresponding to the line I-I' of FIG. 1 to illustrate a method of manufacturing a semiconductor device, according to some embodiments of the inventive concepts.
Figure 14:
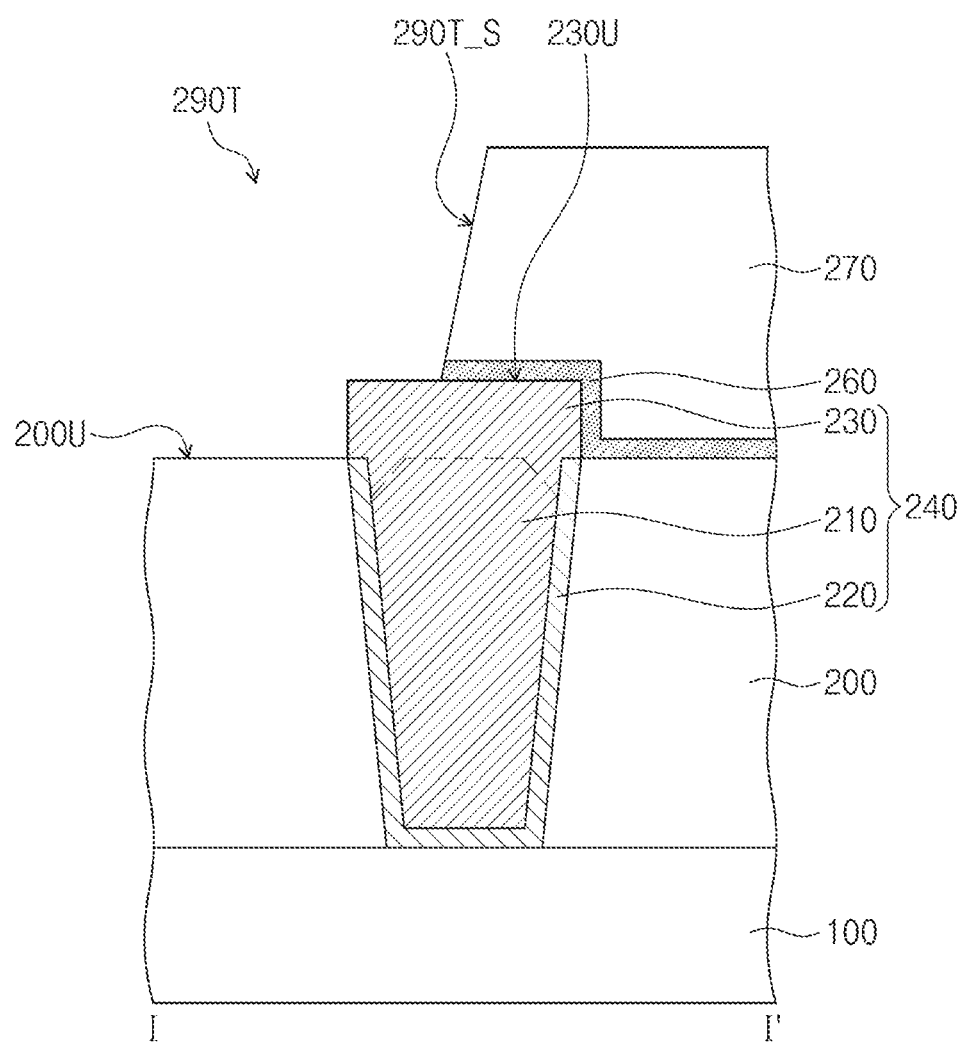

FIGS. 13 and 14 are cross-sectional views corresponding to the line I-I' of FIG. 1 to illustrate a method of manufacturing a semiconductor device, according to some embodiments of the inventive concepts. Hereinafter, differences between the present embodiments and the embodiments described with reference to FIGS. 10 to 12 will be mainly described for the purpose of ease and convenience in explanation.

Referring to FIGS. 1 and 13, a protrusion 230 of a contact plug may be selectively deposited on the body portion 210. The body portion 210, the protrusion 230 and the contact barrier pattern 220 may constitute a contact plug 240. In some embodiments, an etch stop layer 260 may be formed to cover the top surface 230U of the protrusion 230 and may be in contact with the top surface 230U of the protrusion 230. In the present embodiments, the capping layer 250 described with reference to FIG. 11 may be omitted. The etch stop layer 260 may extend onto the top surface 200U of the first interlayer insulating layer 200. A second interlayer insulating layer 270 may be formed on the etch stop layer 260. The second interlayer insulating layer 270 may be formed to cover the protrusion 230 and the first interlayer insulating layer 200. The etch stop layer 260 may be disposed between the protrusion 230 and the second interlayer insulating layer 270 and may extend between the first interlayer insulating layer 200 and the second interlayer insulating layer 270.

Referring to FIGS. 1 and 14, a line trench 290T may be formed in the second interlayer insulating layer 270. The formation of the line trench 290T may include etching a portion of the second interlayer insulating layer 270 and a portion of the etch stop layer 260. The line trench 290T may expose a portion of the top surface 230U of the protrusion 230 and a portion of the top surface 200U of the first interlayer insulating layer 200.

In some embodiments, a line barrier pattern 280 and a conductive line 290 may be formed in the line trench 290T as illustrated in FIG. 6. The line barrier pattern 280 may be disposed between the conductive line 290 and the protrusion 230 and may be in contact with the portion of the top surface 230U of the protrusion 230.

In certain embodiments, a line barrier pattern 280 and a conductive line 290 may be formed in the line trench 290T as illustrated in FIG. 7. For example, the formation of the line barrier pattern 280 and the conductive line 290 may include forming a line barrier layer filling a portion of the line trench 290T on the second interlayer insulating layer 270, removing a portion of the line barrier layer adjacent to the top surface 230U of the protrusion 230, forming a conductive layer filling a remaining portion of the line trench 290T on the line barrier layer, and planarizing the conductive layer and the line barrier layer until the top surface of the second interlayer insulating layer 270 is exposed. In the present embodiments, since the portion of the line barrier layer adjacent to the top surface 230U of the protrusion 230 is removed, a portion of the top surface 230U of the protrusion 230 may be exposed. The conductive line 290 may be in contact with the exposed portion of the top surface 230U of the protrusion 230.

Figure 15:
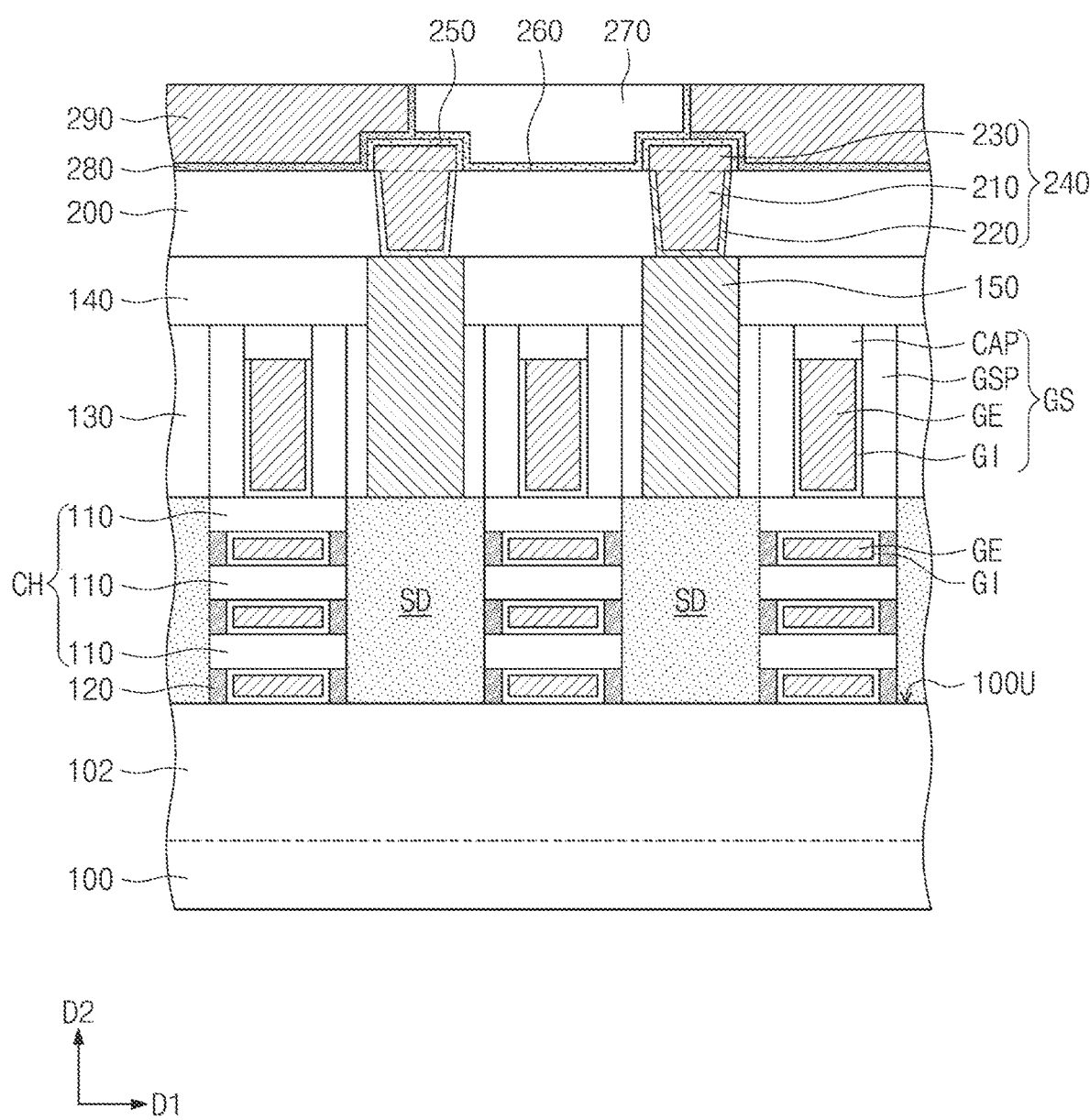
FIGS. 15 and 16 are cross-sectional views illustrating semiconductor devices according to some embodiments of the inventive concepts.

FIG. 15 is a cross-sectional view illustrating a semiconductor device according to some embodiments of the inventive concepts. Referring to FIG. 15, a substrate 100 including an active region 102 may be provided. The substrate 100 may be a semiconductor substrate. For example, the substrate 100 may be a silicon substrate or a silicon-on-insulator (SOI) substrate. The active region 102 may extend in a first direction D1 parallel to a top surface 100U of the substrate 100 and may protrude upward from a lower portion of the substrate 100 in a second direction D2 perpendicular to the top surface 100U of the substrate 100. Even though not shown in the drawings, device isolation patterns may be disposed on the substrate 100 to define the active region 102.

A channel pattern CH and source/drain patterns SD may be disposed on the active region 102. The source/drain patterns SD may be spaced apart from each other in the first direction D1 with the channel pattern CH interposed therebetween. In some embodiments, the channel pattern CH may include a plurality of semiconductor patterns 110 spaced apart from each other in the second direction D2. A lowermost one of the semiconductor patterns 110 may be spaced apart from the active region 102 in the second direction D2. The semiconductor patterns 110 may be disposed between the source/drain patterns SD and may be connected to the source/drain patterns SD. Each of the source/drain patterns SD may be in contact with sidewalls of the semiconductor patterns 110. Each of the semiconductor patterns 110 may connect the source/drain patterns SD to each other. The number of the semiconductor patterns 110 is three in FIG. 15. However, embodiments of the inventive concepts are not limited thereto. The semiconductor patterns 110 may include at least one of silicon (Si), silicon-germanium (SiGe), or germanium (Ge).

The source/drain patterns SD may include epitaxial patterns formed using the semiconductor patterns 110 and the active region 102 as a seed. The source/drain patterns SD may include at least one of silicon-germanium (SiGe), silicon (Si), or silicon carbide (SiC). In some embodiments, the source/drain patterns SD may provide tensile strain to the channel pattern CH. For example, when the semiconductor patterns 110 include silicon (Si), the source/drain patterns SD may include silicon (Si) and/or silicon carbide (SiC). In certain embodiments, the source/drain patterns SD may provide compressive strain to the channel pattern CH. For example, when the semiconductor patterns 110 include silicon (Si), the source/drain patterns SD may include silicon-germanium (SiGe). The source/drain patterns SD may further include dopants. The dopants may be employed to improve electrical characteristics of a transistor including the source/drain patterns SD. When the transistor is an N-channel metal-oxide-semiconductor field effect transistor (NMOSFET), the dopants may include, for example, phosphorus (P). When the transistor is a P-channel metal-oxide-semiconductor field effect transistor (PMOSFET), the dopants may include, for example, boron (B).

A gate structure GS may be provided on the channel pattern CH and may intersect the channel pattern CH. The channel pattern CH may overlap with the gate structure GS, and the source/drain patterns SD may be disposed at both sides of the gate structure GS, respectively.

The gate structure GS may include a gate electrode GE, a gate insulating pattern GI between the gate electrode GE and the channel pattern CH, gate spacers GSP on sidewalls of the gate electrode GE, and a gate capping pattern CAP on a top surface of the gate electrode GE. The gate insulating pattern GI may extend between the gate electrode GE and the gate spacers GSP, and a topmost surface of the gate insulating pattern GI may be substantially coplanar with the top surface of the gate electrode GE. The gate electrode GE may cover a topmost surface of the channel pattern CH and may fill a space between the channel pattern CH and the active region 102 and spaces between the semiconductor patterns 110. The gate insulating pattern GI may be disposed between the gate electrode GE and each of the semiconductor patterns 110. Each of the semiconductor patterns 110 may be spaced apart from the gate electrode GE with the gate insulating pattern GI interposed therebetween. The gate structure GS, the channel pattern CH and the source/drain patterns SD may constitute a multi-bridge channel field effect transistor (MBCFET).

The gate electrode GE may include at least one of a doped semiconductor material, a conductive metal nitride, or a metal. The gate insulating pattern GI may include at least one of a silicon oxide layer, a silicon nitride layer, a silicon oxynitride layer, or a high-k dielectric layer. The high-k dielectric layer may include a material of which a dielectric constant is higher than that of a silicon oxide layer. For example, the high-k dielectric layer may include a hafnium oxide (HfO) layer, an aluminum oxide (AlO) layer, or a tantalum oxide (TaO) layer. Each of the gate capping pattern CAP and the gate spacers GSP may include at least one of a silicon oxide layer, a silicon nitride layer, or a silicon oxynitride layer.

Spacer patterns 120 may be provided between each of the source/drain patterns SD and the gate electrode GE. The spacer patterns 120 may be provided at each side of the gate electrode GE and may be spaced apart from each other in the second direction D2. The spacer patterns 120 and the semiconductor patterns 110 may be alternately and repeatedly stacked in the second direction D2. Each of the spacer patterns 120 may be disposed between the semiconductor patterns 110 vertically adjacent to each other or between the lowermost semiconductor pattern 110 and the active region 102. Each of the source/drain patterns SD may be in contact with the semiconductor patterns 110 and may be spaced apart from the gate electrode GE with the spacer patterns 120 interposed therebetween. The gate insulating pattern GI may be disposed between the gate electrode GE and each of the semiconductor patterns 110 and may extend between the gate electrode GE and each of the spacer patterns 120. Each of the spacer patterns 120 may be in contact with the gate insulating pattern GI.

A lower interlayer insulating layer 130 may be provided on the substrate 100 and may cover the gate structure GS and the source/drain patterns SD. For example, the lower interlayer insulating layer 130 may include at least one of a silicon oxide layer, a silicon nitride layer, a silicon oxynitride layer, or a low-k dielectric layer. A top surface of the gate capping pattern CAP may be substantially coplanar with a top surface of the lower interlayer insulating layer 130. The gate spacer GSP may be disposed between the gate capping pattern CAP and the lower interlayer insulating layer 130. An upper interlayer insulating layer 140 may be disposed on the lower interlayer insulating layer 130 and may cover the top surface of the gate capping pattern CAP. For example, the upper interlayer insulating layer 140 may include at least one of a silicon oxide layer, a silicon nitride layer, a silicon oxynitride layer, or a low-k dielectric layer.

Lower contact plugs 150 may penetrate the lower and upper interlayer insulating layers 130 and 140 so as to be electrically connected to the source/drain patterns SD. The lower contact plugs 150 may be disposed at both sides of the gate structure GS, and each of the lower contact plugs 150 may be connected to a corresponding one of the source/drain patterns SD. The lower contact plugs 150 may include a metal and/or a conductive metal nitride.

A first interlayer insulating layer 200 may be disposed on the upper interlayer insulating layer 140. The first interlayer insulating layer 200 may be substantially the same as the first interlayer insulating layer 200 described with reference to FIGS. 1 to 9.

A conductive line 290 and a second interlayer insulating layer 270 may be disposed on the first interlayer insulating layer 200. A contact plug 240 may penetrate the first interlayer insulating layer 200 and may be electrically connected to the conductive line 290. The conductive line 290 may overlap with a portion of a protrusion 230 of the contact plug 240, and the second interlayer insulating layer 270 may overlap with another portion of the protrusion 230 of the contact plug 240. The contact plug 240 may penetrate the first interlayer insulating layer 200 so as to be connected to a corresponding one of the lower contact plugs 150. The conductive line 290, the second interlayer insulating layer 270 and the contact plug 240 may be substantially the same as the conductive line 290, the second interlayer insulating layer 270 and the contact plug 240, described with reference to FIGS. 1 to 9.

A line barrier pattern 280 may be disposed between the conductive line 290 and the first interlayer insulating layer 200 and between the conductive line 290 and the second interlayer insulating layer 270. In some embodiments, the line barrier pattern 280 may extend between the conductive line 290 and the protrusion 230 of the contact plug 240. An etch stop layer 260 may be disposed between the second interlayer insulating layer 270 and the first interlayer insulating layer 200 and may extend between the second interlayer insulating layer 270 and the protrusion 230 of the contact plug 240. A capping layer 250 may be disposed between the etch stop layer 260 and the protrusion 230 of the contact plug 240. In some embodiments, the capping layer 250 may extend between the line barrier pattern 280 and the protrusion 230 of the contact plug 240. The line barrier pattern 280, the etch stop layer 260 and the capping layer 250 may be substantially the same as the line barrier pattern 280, the etch stop layer 260 and the capping layer 250, described with reference to FIGS. 1 to 9.

Figure 16:
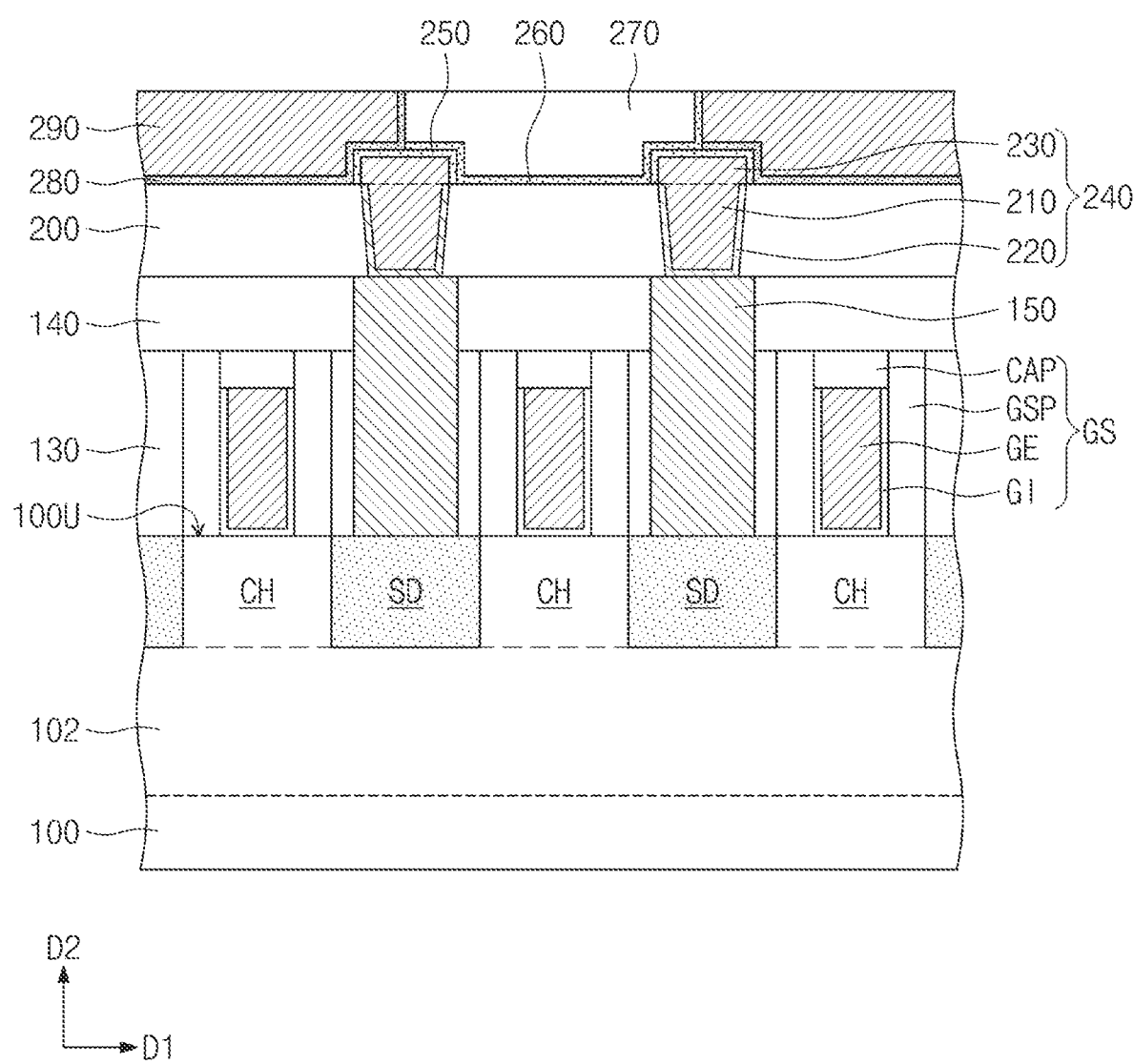

FIG. 16 is a cross-sectional view illustrating a semiconductor device according to some embodiments of the inventive concepts. Hereinafter, differences between the present embodiments and the embodiments described with reference to FIG. 15 will be mainly described for the purpose of ease and convenience in explanation.

Referring to FIG. 16, a substrate 100 including an active region 102 may be provided. The active region 102 may extend in a first direction D1 parallel to a top surface 1000 of the substrate 100 and may protrude upward from a lower portion of the substrate 100 in a second direction D2 perpendicular to the top surface 1000 of the substrate 100. Even though not shown in the drawings, device isolation patterns may be disposed on the substrate 100 to define the active region 102.

A channel pattern CH and source/drain patterns SD may be disposed on the active region 102. The source/drain patterns SD may be spaced apart from each other in the first direction D1 with the channel pattern CH interposed therebetween. In some embodiments, the channel pattern CH may be an upper portion of the active region 102, which is exposed by the device isolation patterns. The source/drain patterns SD may include epitaxial patterns formed using the channel pattern CH and the active region 102 as a seed.

A gate structure GS may be provided on the channel pattern CH and may intersect the channel pattern CH. The channel pattern CH may overlap with the gate structure GS, and the source/drain patterns SD may be disposed at both sides of the gate structure GS, respectively. Even though not shown in the drawings, the channel pattern CH may have sidewalls opposite to each other in a third direction which is parallel to the top surface 1000 of the substrate 100 and is perpendicular to the first direction D1, and the gate structure GS may cover the opposite sidewalls of the channel pattern CH. The gate structure GS, the channel pattern CH and the source/drain patterns SD may constitute a fin field effect transistor (FINFET).

A lower interlayer insulating layer 130 may be provided on the substrate 100 and may cover the gate structure GS and the source/drain patterns SD. An upper interlayer insulating layer 140 may be disposed on the lower interlayer insulating layer 130. Lower contact plugs 150 may penetrate the lower and upper interlayer insulating layers 130 and 140 so as to be electrically connected to the source/drain patterns SD.

A first interlayer insulating layer 200 may be disposed on the upper interlayer insulating layer 140. The first interlayer insulating layer 200 may be substantially the same as the first interlayer insulating layer 200 described with reference to FIGS. 1 to 9.

A conductive line 290 and a second interlayer insulating layer 270 may be disposed on the first interlayer insulating layer 200. A contact plug 240 may penetrate the first interlayer insulating layer 200 and may be electrically connected to the conductive line 290. The conductive line 290 may overlap with a portion of a protrusion 230 of the contact plug 240, and the second interlayer insulating layer 270 may overlap with another portion of the protrusion 230 of the contact plug 240. The contact plug 240 may penetrate the first interlayer insulating layer 200 so as to be connected to a corresponding one of the lower contact plugs 150. The conductive line 290, the second interlayer insulating layer 270 and the contact plug 240 may be substantially the same as the conductive line 290, the second interlayer insulating layer 270 and the contact plug 240, described with reference to FIGS. 1 to 9.

A line barrier pattern 280 may be disposed between the conductive line 290 and the first interlayer insulating layer 200 and between the conductive line 290 and the second interlayer insulating layer 270. In some embodiments, the line barrier pattern 280 may extend between the conductive line 290 and the protrusion 230 of the contact plug 240. An etch stop layer 260 may be disposed between the second interlayer insulating layer 270 and the first interlayer insulating layer 200 and may extend between the second interlayer insulating layer 270 and the protrusion 230 of the contact plug 240. A capping layer 250 may be disposed between the etch stop layer 260 and the protrusion 230 of the contact plug 240. In some embodiments, the capping layer 250 may extend between the line barrier pattern 280 and the protrusion 230 of the contact plug 240. The line barrier pattern 280, the etch stop layer 260 and the capping layer 250 may be substantially the same as the line barrier pattern 280, the etch stop layer 260 and the capping layer 250, described with reference to FIGS. 1 to 9.

A semiconductor device according to some embodiments of the inventive concepts may include a negative capacitance (NC) field effect transistor (FET) using a negative capacitor. For example, the gate insulating pattern GI may include a ferroelectric material layer having ferroelectric properties, and a paraelectric material layer having paraelectric properties.

The ferroelectric material layer may have a negative capacitance, and the paraelectric material layer may have a positive capacitance. For example, when two or more capacitors are connected in series to each other and a capacitance of each of the capacitors has a positive value, a total capacitance may be reduced to be less than the capacitance of each of the capacitors. On the contrary, when at least one of two or more capacitors connected in series to each other has a negative value, a total capacitance may have a positive value and may be greater than an absolute value of a capacitance of each of the capacitors.

When the ferroelectric material layer having the negative capacitance is connected in series to the paraelectric material layer having the positive capacitance, a total capacitance value of the ferroelectric and paraelectric material layers connected in series may increase. The transistor including the ferroelectric material layer may have a subthreshold swing (SS) less than 60 mV/decade at room temperature by using the increase in the total capacitance value.

The ferroelectric material layer may have the ferroelectric properties. For example, the ferroelectric material layer may include at least one of hafnium oxide, hafnium zirconium oxide, barium strontium titanium oxide, barium titanium oxide, or lead zirconium titanium oxide. Here, for an example, the hafnium zirconium oxide may be a material formed by doping hafnium oxide with zirconium (Zr). For another example, the hafnium zirconium oxide may be a compound of hafnium (Hf), zirconium (Zr), and oxygen (O).

The ferroelectric material layer may further include dopants doped therein. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). A kind of the dopants included in the ferroelectric material layer may be changed depending on a kind of the ferroelectric material included in the ferroelectric material layer.

When the ferroelectric material layer includes hafnium oxide, the dopants included in the ferroelectric material layer may include at least one of, for example, gadolinium (Gd), silicon (Si), zirconium (Zr), aluminum (Al), or yttrium (Y).

When the dopants are aluminum (Al), the ferroelectric material layer may include aluminum of 3 at % (atomic %) to 8 at %. Here, a ratio of the dopants may be a ratio of the amount of aluminum to a sum of the amounts of hafnium and aluminum.

When the dopants are silicon (Si), the ferroelectric material layer may include silicon of 2 at % to 10 at %. When the dopants are yttrium (Y), the ferroelectric material layer may include yttrium of 2 at % to 10 at %. When the dopants are gadolinium (Gd), the ferroelectric material layer may include gadolinium of 1 at % to 7 at %. When the dopants are zirconium (Zr), the ferroelectric material layer may include zirconium of 50 at % to 80 at %.

The paraelectric material layer may have the paraelectric properties. For example, the paraelectric material layer may include at least one of silicon oxide or a metal oxide having a high-k dielectric constant. For example, the metal oxide included in the paraelectric material layer may include at least one of hafnium oxide, zirconium oxide, or aluminum oxide. However, embodiments of the inventive concepts are not limited thereto.

The ferroelectric material layer and the paraelectric material layer may include the same material. The ferroelectric material layer may have the ferroelectric properties, but the paraelectric material layer may not have the ferroelectric properties. For example, when the ferroelectric material layer and the paraelectric material layer include hafnium oxide, a crystal structure of hafnium oxide included in the ferroelectric material layer may be different from a crystal structure of hafnium oxide included in the paraelectric material layer.

The ferroelectric material layer may have a thickness showing the ferroelectric properties. For example, the thickness of the ferroelectric material layer may range from 0.5 nm to 10 nm. However, embodiments of the inventive concepts are not limited thereto. A critical thickness showing the ferroelectric properties may be changed depending on a kind of a ferroelectric material, and thus the thickness of the ferroelectric material layer may be changed depending on a kind of the ferroelectric material included therein.

For some examples, the gate insulating pattern GI may include a single ferroelectric material layer. For other examples, the gate insulating pattern GI may include a plurality of ferroelectric material layers spaced apart from each other. The gate insulating pattern GI may have a stack structure in which ferroelectric material layers and paraelectric material layers are alternately stacked.

Figure 17:
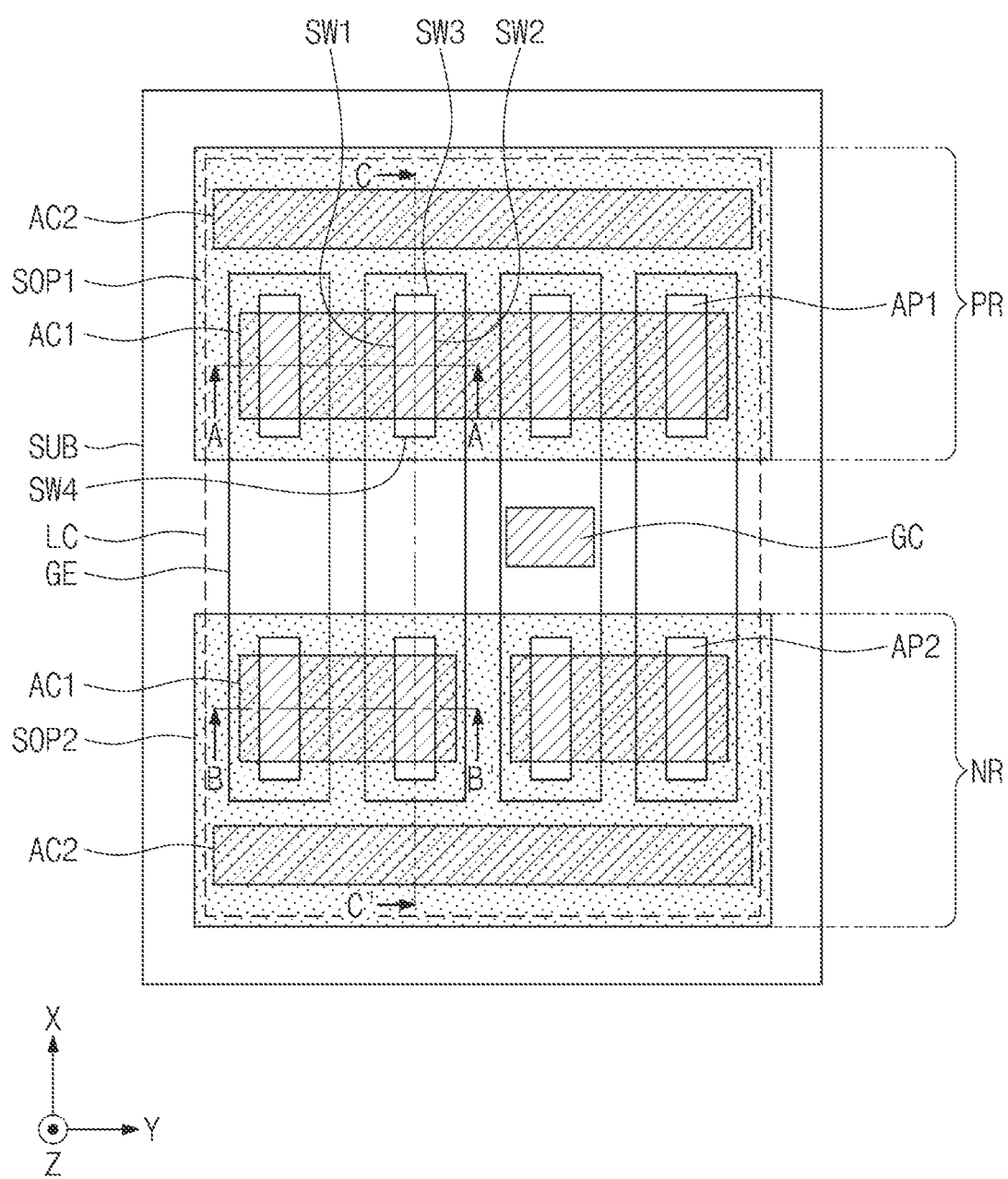
FIG. 17 is a plan view illustrating a semiconductor device according to some embodiments of the inventive concepts.
Figure 18:
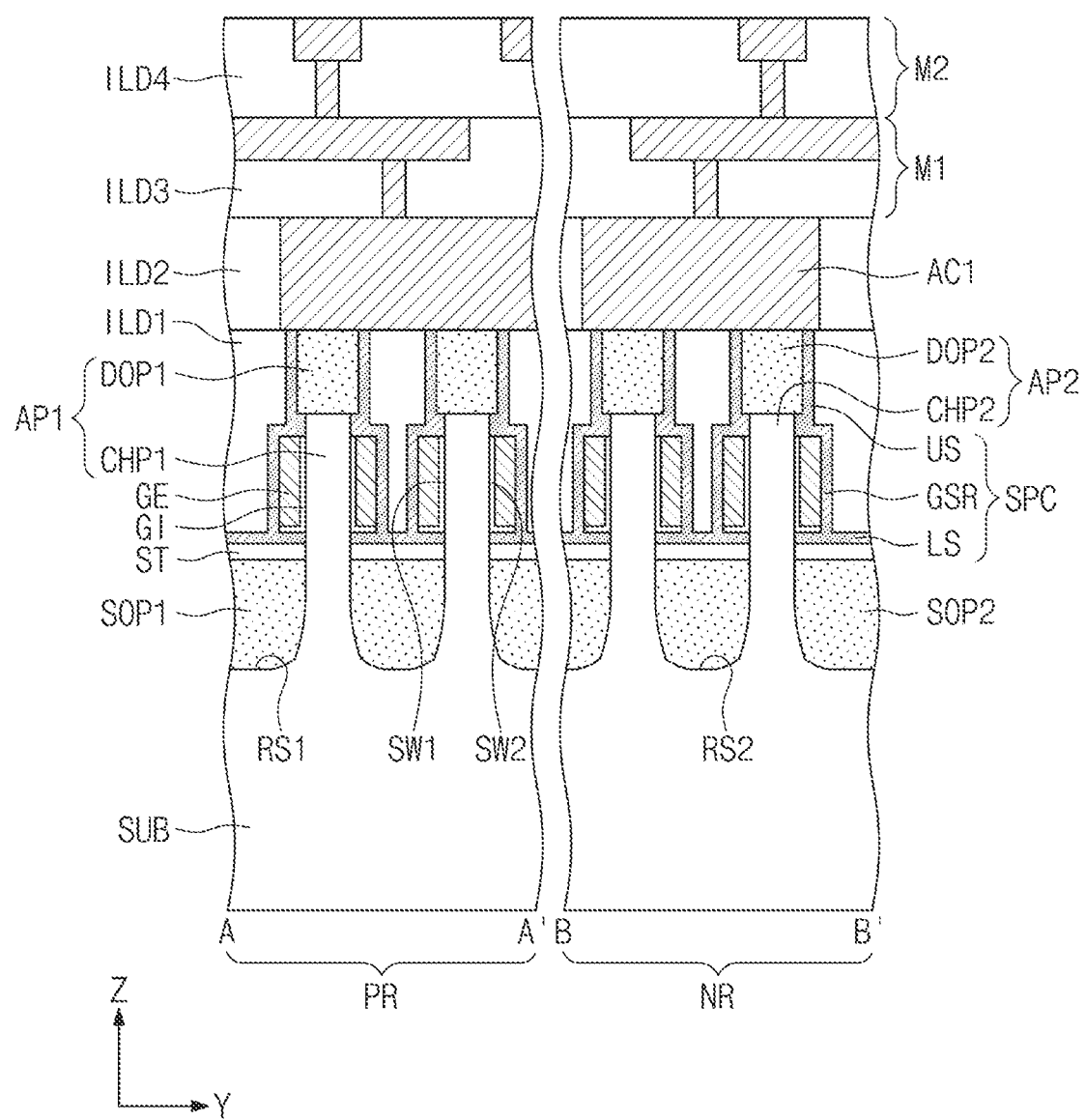
FIG. 18 is a cross-sectional view taken along lines A-A' and B-B' of FIG. 17.
Figure 19:
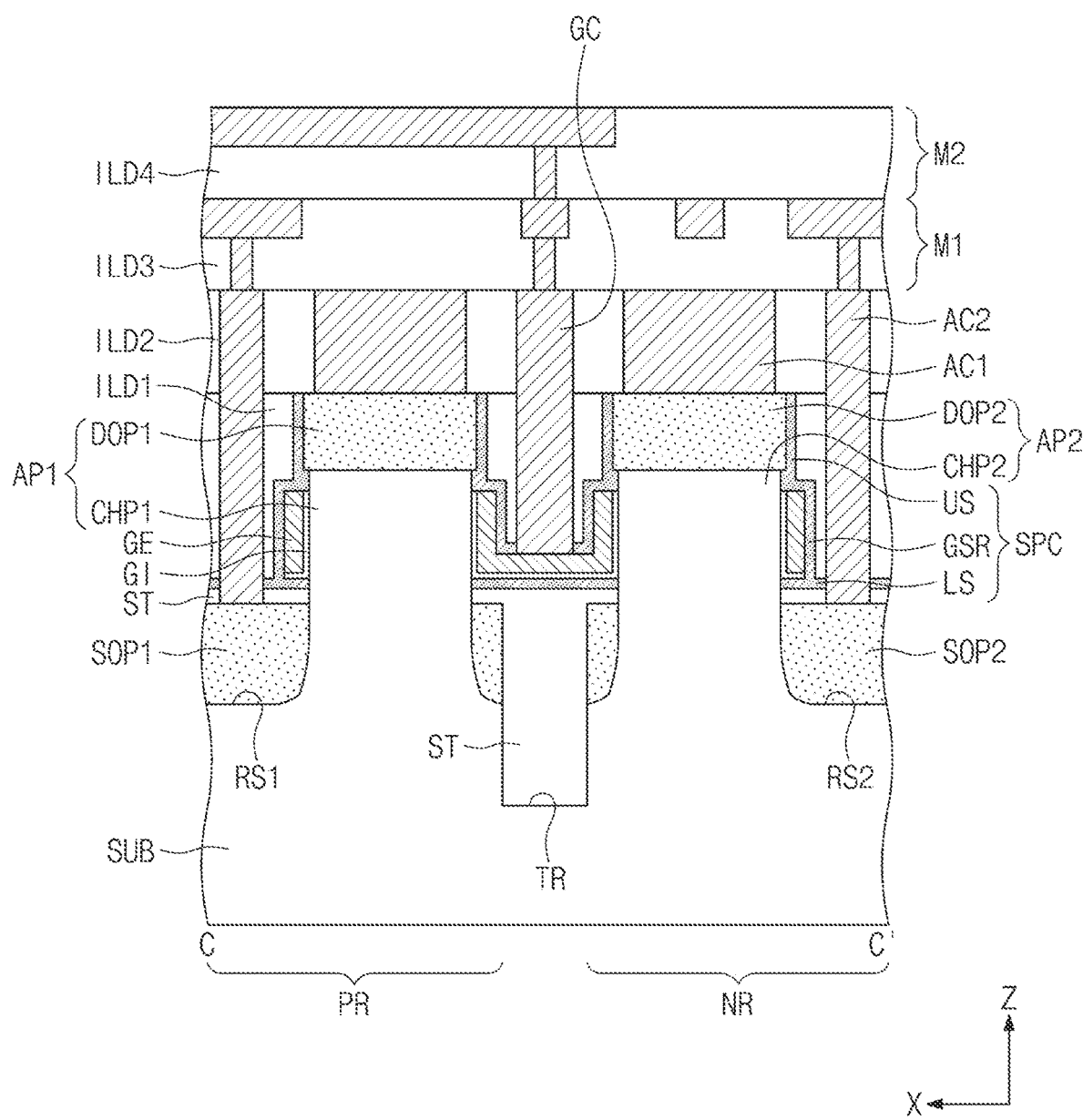
FIG. 19 is a cross-sectional view taken along a line C-C' of FIG. 17.

FIG. 17 is a plan view illustrating a semiconductor device according to some embodiments of the inventive concepts. FIG. 18 is a cross-sectional view taken along lines A-A' and B-B' of FIG. 17. FIG. 19 is a cross-sectional view taken along a line C-C' of FIG. 17. Referring to FIGS. 17 to 19, a logic cell LC may be provided on a substrate SUB. The logic cell LC may represent a logic element (e.g., an inverter, a flip-flop, etc.) for performing a specific function. The logic cell LC may include vertical field effect transistors (hereinafter, referred to as vertical transistors) and interconnection lines connecting the vertical transistors, which constitute the logic element.

The logic cell LC on the substrate SUB may include a first active region PR and a second active region NR. For example, the first active region PR may be a PMOSFET region, and the second active region NR may be an NMOSFET region. The first and second active regions PR and NR may be defined by a trench TR formed in an upper portion of the substrate SUB. The first and second active regions PR and NR may be spaced apart from each other in an X direction.

A first lower epi pattern SOP1 may be provided on the first active region PR, and a second lower epi pattern SOP2 may be provided on the second active region NR. The first lower epi pattern SOP1 may overlap with the first active region PR in a plan view, and the second lower epi pattern SOP2 may overlap with the second active region NR in a plan view. The first and second lower epi patterns SOP1 and SOP2 may be epitaxial patterns formed by a selective epitaxial growth (SEG) process, however, other growth processes may also be used. The first lower epi pattern SOP1 may be provided in a first recess region RS1 of the substrate SUB, and the second lower epi pattern SOP2 may be provided in a second recess region RS2 of the substrate SUB.

First active patterns AP1 may be provided on the first active region PR, and second active patterns AP2 may be provided on the second active region NR. Each of the first and second active patterns AP1 and AP2 may have a vertically protruding fin shape. Each of the first and second active patterns AP1 and AP2 may have a bar shape extending in the X direction when viewed in a plan view. The first active patterns AP1 may be arranged in a Y direction, and the second active patterns AP2 may be arranged in the Y direction.

Each of the first active patterns AP1 may include a first channel pattern CHP1 vertically protruding from the first lower epi pattern SOP1, and a first upper epi pattern DOP1 on the first channel pattern CHP1. Each of the second active patterns AP2 may include a second channel pattern CHP2 vertically protruding from the second lower epi pattern SOP2, and a second upper epi pattern DOP2 on the second channel pattern CHP2.

A device isolation layer ST may be provided on the substrate SUB to fill the trench TR. The device isolation layer ST may cover top surfaces of the first and second lower epi patterns SOP1 and SOP2. The first and second active patterns AP1 and AP2 may vertically protrude above the device isolation layer ST.

A plurality of gate electrodes GE extending in the X direction in parallel to each other may be provided on the device isolation layer ST. The gate electrodes GE may be arranged in the Y direction. The gate electrode GE may surround the first channel pattern CHP1 of the first active pattern AP1 and may surround the second channel pattern CHP2 of the second active pattern AP2. For example, the first channel pattern CHP1 of the first active pattern AP1 may have first to fourth sidewalls SW1 to SW4. The first and second sidewalls SW1 and SW2 may be opposite to each other in the Y direction, and the third and fourth sidewalls SW3 and SW4 may be opposite to each other in the X direction. The gate electrode GE may be provided on the first to fourth sidewalls SW1 to SW4. In other words, the gate electrode GE may surround the first to fourth sidewalls SW1 to SW4.

A gate insulating pattern GI may be disposed between the gate electrode GE and each of the first and second channel patterns CHP1 and CHP2. The gate insulating pattern GI may cover a bottom surface of the gate electrode GE and an inner sidewall of the gate electrode GE. For example, the gate insulating pattern GI may directly cover the first to fourth sidewalls SW1 to SW4 of the first channel pattern CHP1 of the first active pattern AP1.

The first and second upper epi patterns DOP1 and DOP2 may vertically protrude above the gate electrode GE. A top surface of the gate electrode GE may be lower than a bottom surface of each of the first and second upper epi patterns DOP1 and DOP2. In other words, each of the first and second active patterns AP1 and AP2 may have a structure which vertically protrudes from the substrate SUB to penetrate the gate electrode GE.

A semiconductor device according to the present embodiments may include the vertical transistors in which carriers move in a Z direction. For example, when the transistor is turned-on by applying a voltage to the gate electrode GE, the carriers may move from the lower epi pattern SOP1 or SOP2 to the upper epi pattern DOP1 or DOP2 through the channel pattern CHP1 or CHP2. The gate electrode GE according to the present embodiments may completely surround the sidewalls SW1 to SW4 of the channel patterns CHP1 and CHP2. The transistor according to the present embodiments may be a 3D field effect transistor (e.g., a VFET) having a gate-all-around structure. Since the gate surrounds the channel, the semiconductor device according to the present embodiments may have excellent electrical characteristics.

A spacer SPC covering the gate electrodes GE and the first and second active patterns AP1 and AP2 may be provided on the device isolation layer ST. The spacer SPC may include a silicon nitride layer or a silicon oxynitride layer. The spacer SPC may include a lower spacer LS, an upper spacer US, and a gate spacer GSR between the lower and upper spacers LS and US.

The lower spacer LS may directly cover a top surface of the device isolation layer ST. By the lower spacer LS, the gate electrodes GE may be spaced apart from the device isolation layer ST in the Z direction. The gate spacer GSR may cover the top surface and an outer sidewall of each of the gate electrodes GE. The upper spacer US may cover the first and second upper epi patterns DOP1 and DOP2. The upper spacer US may not cover top surfaces of the first and second upper epi patterns DOP1 and DOP2 but may expose the top surfaces.

A first lower interlayer insulating layer ILD1 may be provided on the spacer SPC. A top surface of the first lower interlayer insulating layer ILD1 may be substantially coplanar with the top surfaces of the first and second upper epi patterns DOP1 and DOP2. A second lower interlayer insulating layer ILD2, a first upper interlayer insulating layer ILD3 and a second upper interlayer insulating layer ILD4 may be sequentially stacked on the first lower interlayer insulating layer ILD1. The second lower interlayer insulating layer ILD2 may cover the top surfaces of the first and second upper epi patterns DOP1 and DOP2.

First active contacts AC1 may penetrate the second lower interlayer insulating layer ILD2 so as to be connected to the first and second upper epi patterns DOP1 and DOP2. Second active contacts AC2 may sequentially penetrate the second lower interlayer insulating layer ILD2, the first lower interlayer insulating layer ILD1, the lower spacer LS and the device isolation layer ST so as to be connected to the first and second lower epi patterns SOP1 and SOP2. A gate contact GC may sequentially penetrate the second lower interlayer insulating layer ILD2, the first lower interlayer insulating layer ILD1 and the gate spacer GSR so as to be connected to the gate electrode GE.

A first metal layer M1 may be provided in the first upper interlayer insulating layer ILD3. A second metal layer M2 may be provided in the second upper interlayer insulating layer ILD4. The first upper interlayer insulating layer ILD3 and the first metal layer M1 (or the second upper interlayer insulating layer ILD4 and the second metal layer M2) may include the first and second interlayer insulating layers 200 and 270, the contact plug 240, the conductive line 290, the line barrier pattern 280, the etch stop layer 260 and the capping layer 250, which were described with reference to FIGS. 1 to 9.

According to the embodiments of the inventive concepts, the electrical characteristics of the semiconductor device may be improved, and the degree of freedom of the design of the semiconductor device may be easily increased.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An integrated circuit device comprising:
a first interlayer insulating layer on a substrate;
an electrically conductive line on the first interlayer insulating layer;
a second interlayer insulating layer, which extends on the first interlayer insulating layer and opposite a sidewall of the line; and
an electrically conductive contact plug, which at least partially penetrates the first interlayer insulating layer and is electrically connected to a portion of the line, said contact plug comprising a protrusion that extends into a space between: (i) the line, which overlaps a first portion of the protrusion, and (ii) the second interlayer insulating layer, which overlaps a second portion of the protrusion;
wherein the protrusion protrudes from an underlying body portion of the contact plug in a direction perpendicular to a top surface of the substrate, and is in direct contact with the body portion;
wherein the contact plug further comprises a contact barrier pattern, which extends between the first interlayer insulating layer and the body portion; and
wherein the protrusion covers and contacts a topmost surface of the contact barrier pattern.

2. The device of claim 1, wherein the protrusion and the body portion of the contact plug comprise the same metal; and wherein the contact barrier pattern comprises a different material from that of the protrusion and the body portion of the contact plug.

3. The device of claim 1, further comprising a line barrier pattern extending between the sidewall of the line and the second interlayer insulating layer; and wherein the line barrier pattern extends on a top surface of the protrusion.

4. An integrated circuit device comprising:
a first interlayer insulating layer on a substrate;
an electrically conductive line on the first interlayer insulating layer;

a second interlayer insulating layer, which extends on the first interlayer insulating layer and opposite a sidewall of the line;

an electrically conductive contact plug, which at least partially penetrates the first interlayer insulating layer and is electrically connected to a portion of the line, said contact plug comprising a protrusion that extends into a space between: (i) the line, which overlaps a first portion of the protrusion, and (ii) the second interlayer insulating layer, which overlaps a second portion of the protrusion;

a line barrier pattern extending between the sidewall of the line and the second interlayer insulating layer; and wherein the line barrier pattern extends on a top surface of the protrusion; and an etch stop layer extending between the second interlayer insulating layer and the first interlayer insulating layer, and extending between the second interlayer insulating layer and the protrusion; and wherein the line barrier pattern extends between the line and a portion of the etch stop layer.

5. The device of claim 4, wherein the sidewall of the line is inclined at an obtuse angle relative to the top surface of the protrusion.

6. The device of claim 4, further comprising a capping layer extending between the etch stop layer and the protrusion, and also extending between the line and the protrusion.

7. The device of claim 6, wherein the capping layer comprises a different material relative to the contact plug.

8. The device of claim 6, wherein the line barrier pattern extends between the capping layer and the line, and between the line and the first interlayer insulating layer.

9. The device of claim 6, wherein the line barrier pattern comprises:
- a first portion between the sidewall of the line and the second interlayer insulating layer; and
- a second portion between the line and the first interlayer insulating layer,
- wherein the line is in contact with the capping layer.

10. The device of claim 4, further comprising a capping layer extending between the etch stop layer and the protrusion; wherein the line barrier pattern extends on the protrusion; and wherein the capping layer extends between a portion of the line barrier pattern and the top surface of the protrusion.

11. The device of claim 10, wherein the line barrier pattern extends between the protrusion and the line, and between the first interlayer insulating layer and the line.

12. The device of claim 10, wherein the line barrier pattern comprises:
- a first portion between the sidewall of the line and the second interlayer insulating layer; and
- a second portion between the line and the first interlayer insulating layer; and wherein the line is in contact with the protrusion.

13. The device of claim 4, wherein the line barrier pattern is in contact with the protrusion, and extends between the protrusion and the line and between the first interlayer insulating layer and the line.

14. The device of claim 4, wherein the line barrier pattern comprises:
- a first portion between the sidewall of the line and the second interlayer insulating layer; and
- a second portion between the line and the first interlayer insulating layer; and
- wherein the line is in contact with the protrusion.

15. The device of claim 4,
- wherein the line barrier pattern comprises: a first portion between the sidewall of the line and the second interlayer insulating layer, and a second portion between the line and the first interlayer insulating layer;
- wherein the etch stop layer comprises: a first portion between the second interlayer insulating layer and the first interlayer insulating layer, and a second portion between the second interlayer insulating layer and the protrusion, and
- wherein a bottom surface of the first portion of the etch stop layer is located at substantially the same height as a bottom surface of the second portion of the line barrier pattern, relative to a surface of the substrate.

16. The device of claim 15, wherein the line barrier pattern further comprises a third portion between the line and the protrusion; and wherein a bottom surface of the third portion of the line barrier pattern is located at substantially the same height as or a lower height than a bottom surface of the second portion of the etch stop layer on a topmost surface of the protrusion.

17. An integrated circuit device, comprising:
- a substrate;
- a first electrically insulating layer on the substrate;
- an electrically conductive contact plug extending at least partially through the first electrically insulating layer, said contact plug comprising a protrusion having a top surface that is spaced farther from the substrate relative to a top surface of a portion of the first electrically insulating layer extending adjacent the contact plug;
- an electrically conductive line having a terminal end, which extends on a first portion of the protrusion; and
- a second electrically insulating layer extending on a second portion of the protrusion and on the first electrically insulating layer, said second electrically insulating layer having a sidewall extending opposite a sidewall of the terminal end of the electrically conductive line.

\* \* \* \* \*